United States Patent
Ahn et al.

(10) Patent No.: US 7,595,207 B2
(45) Date of Patent: Sep. 29, 2009

(54) METHOD OF EXPOSING LAYER WITH LIGHT AND METHOD OF MANUFACTURING THIN FILM TRANSISTOR SUBSTRATE FOR LIQUID CRYSTAL DISPLAY DEVICE USING THE SAME

(75) Inventors: Soon-Il Ahn, Busan (KR); Byoung-Sun Na, Gyeonggi-do (KR); Jeong-Young Lee, Yongin-si (KR); You-Lee Song, Seoul (KR)

(73) Assignee: Samsung Electronics, Co., Ltd., Suwon-Si, Gyeonggi-Do (KR)

( * ) Notice: Subject to any disclaimer, the term of this patent is extended or adjusted under 35 U.S.C. 154(b) by 632 days.

(21) Appl. No.: 10/815,287

(22) Filed: Apr. 1, 2004

(65) Prior Publication Data
US 2004/0266039 A1 Dec. 30, 2004

(30) Foreign Application Priority Data
Jun. 27, 2003 (KR) .................. 10-2003-0042850

(51) Int. Cl.
*H01L 31/12* (2006.01)
*G09G 3/36* (2006.01)
(52) U.S. Cl. ............... 438/29; 257/59; 345/92; 378/35
(58) Field of Classification Search ............ 438/30, 438/152, 149, 161; 378/34, 35
See application file for complete search history.

(56) References Cited

U.S. PATENT DOCUMENTS

| 5,677,754 | A | * | 10/1997 | Makinouchi | ............... 355/53 |
| 5,718,839 | A | * | 2/1998 | Tanuma et al. | ......... 252/299.63 |
| 6,576,378 | B2 | | 6/2003 | Kim | |
| 6,700,600 | B1 | * | 3/2004 | Sandstrom et al. | .......... 347/256 |
| 2003/0211404 | A1 | * | 11/2003 | Kim | ............................. 430/5 |
| 2003/0213966 | A1 | * | 11/2003 | Yang et al. | .................... 257/93 |
| 2003/0218169 | A1 | * | 11/2003 | Isobe et al. | .................. 257/59 |
| 2004/0029024 | A1 | * | 2/2004 | Ohnuma | ........................ 430/5 |

FOREIGN PATENT DOCUMENTS

| JP | 2001-319876 | 11/2001 |
| TW | 463383 | 11/2001 |
| WO | WO00/11707 | 3/2000 |

OTHER PUBLICATIONS

English Abstract for Publication No. 463383.
English Abstract for Publication No.: 2001-319876.
English Abstract for Publication No. WO00/11707.

* cited by examiner

*Primary Examiner*—N Drew Richards
*Assistant Examiner*—Pamela E Perkins
(74) *Attorney, Agent, or Firm*—Frank Chau & Associates, LLC

(57) ABSTRACT

To improve product yield, light is scanned on a layer on a substrate through a mask. A pattern is formed on the substrate by the exposure of the layer. The direction of scanning is substantially perpendicular to a longitudinal direction of the pattern. The capacitance difference due to coupling of the pattern to be formed and a conductive layer formed through an insulation layer is reduced. Thus, failures of a display device are reduced and the product yield is increased.

30 Claims, 34 Drawing Sheets

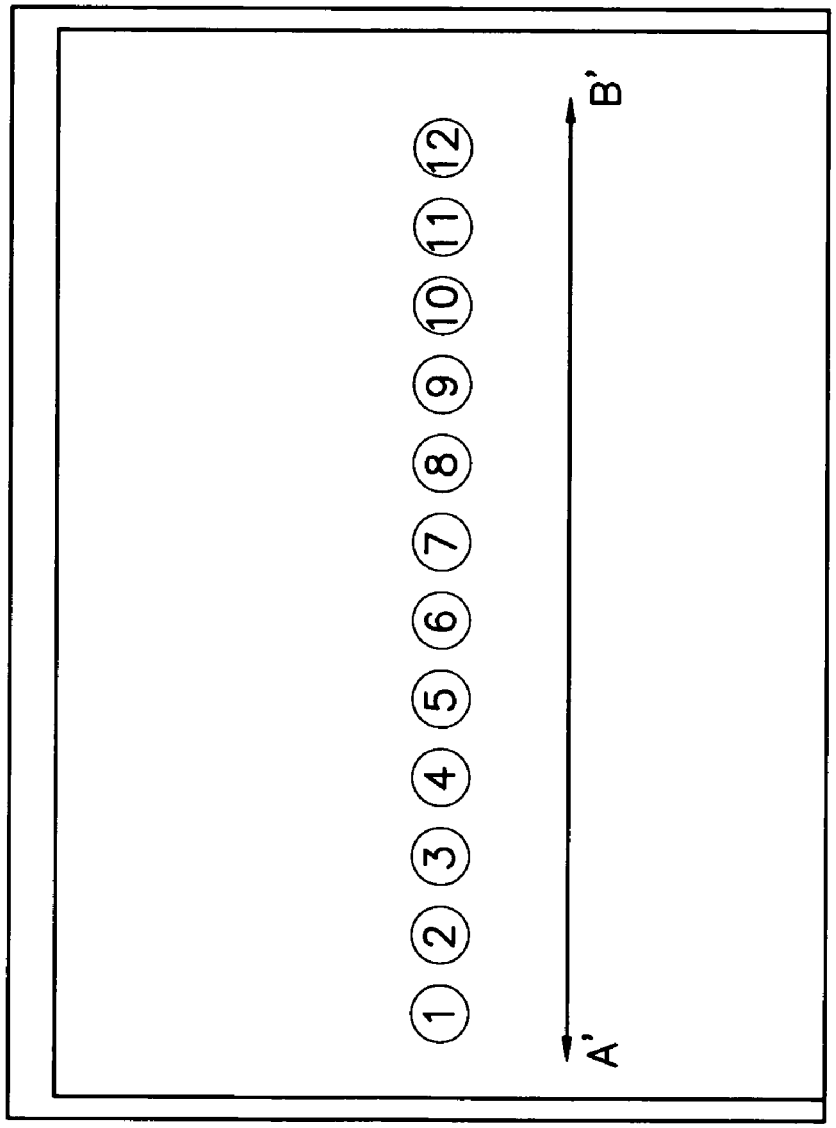

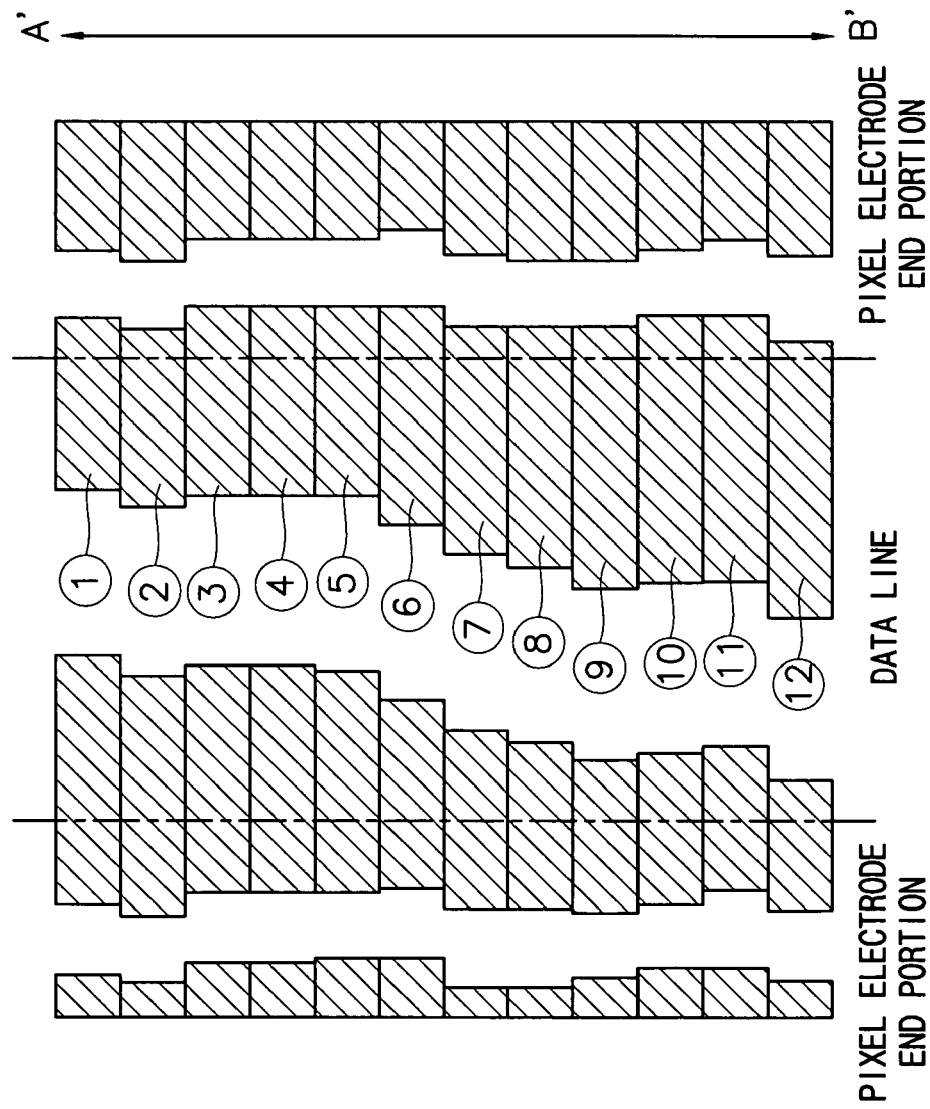

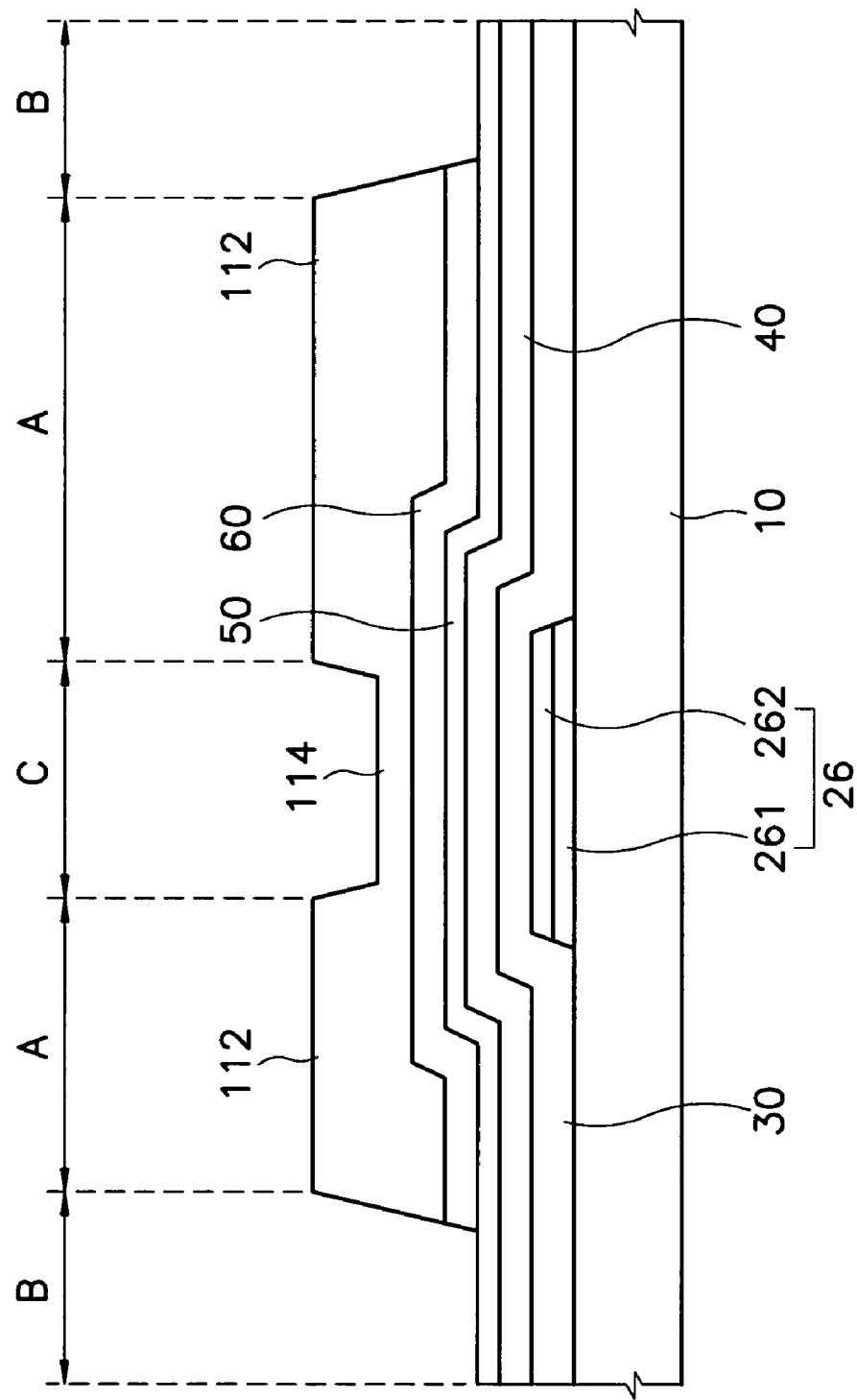

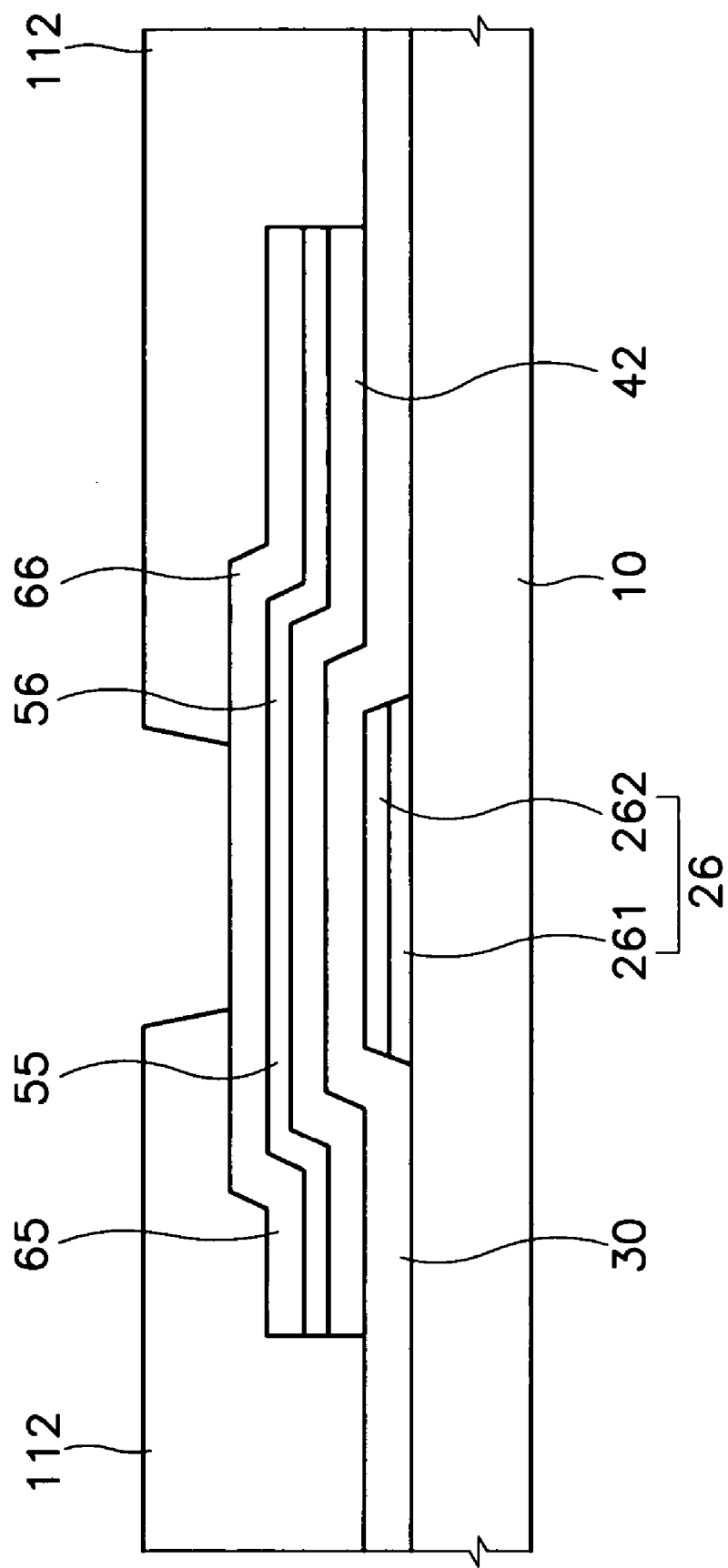

METHOD OF EXPOSING LAYER WITH LIGHT AND METHOD OF MANUFACTURING THIN FILM TRANSISTOR SUBSTRATE FOR LIQUID CRYSTAL DISPLAY DEVICE USING THE SAME

CROSS-REFERENCE TO RELATED APPLICATIONS

This application relies for priority upon Korean Patent Application No. 2003-42850 filed on Jun. 27, 2003, the contents of which are herein incorporated by reference in its entirety.

BACKGROUND OF THE INVENTION

1. Field of the Invention

The present invention relates to a method of exposing a layer with a light and a method of manufacturing a thin film transistor substrate for a liquid crystal display device using the same. More particularly, the present invention relates to a method of exposing a layer with a light that reduces defects caused by a misalignment during the exposure process, and a method of manufacturing a thin film transistor substrate for a liquid crystal display device using the same.

2. Description of the Related Art

Generally, display devices are electric optical devices converting electrical signals into visual signals that provide information. A liquid crystal display device includes upper and lower substrates, and a liquid crystal layer interposed between the upper and lower substrates. The upper substrate includes common electrodes and color filters. The lower substrate includes thin film transistors and pixel electrodes. In the liquid crystal display device, electric fields formed between the electrodes on the upper and lower substrates adjust the arrangements of liquid crystal molecules to control the quantity of light that passes through the liquid crystal layer.

The liquid crystal display device has been used for information display terminals such as a viewfinder of a video camera, a color television set, a high definition projection-type television, a personal computer, a word processor, a computer monitor, etc. Particularly, an active matrix type twisted nematic (TN) mode liquid crystal display device adopts thin film transistors as a switching device. Thus, high contrast can be maintained even when an image requiring high capacity is displayed.

In the active matrix type liquid crystal display device, the switching devices such as the thin film transistors are formed on the pixel electrodes arranged in a matrix form. Electrical signals are provided to each of the pixel electrodes through the switching devices to control the optical characteristics of the liquid crystal.

The liquid crystal display device includes a thin film transistor substrate (or array substrate) having the switching devices.

The thin film transistor substrate also has gate lines electrically connected to gate electrodes of the thin film transistors, data lines electrically connected to data (source) electrodes, gate pads transmitting signals from outside to the gate lines, and data pads transmitting signals from outside to the data lines. A pixel region that is defined by crossing of the gate line and the data line has a pixel electrode that is electrically connected to a drain electrode of the thin film transistor.

When the liquid crystal display device is operated, positive voltage and negative voltage are alternately applied to the data lines, and the voltage of the pixel electrodes varies in accordance with the voltage applied to the data lines.

The gate lines, data lines and pixel electrodes are formed on the thin film transistor substrate by photolithography processes. A stepper type exposure process or an aligner type exposure process may be performed as an exposure process. In stepper type exposure process, the thin film transistor is formed into a plurality of virtual blocks (or cells), and each of the blocks is exposed in sequence. In aligner process, the thin film transistor is exposed at once.

A general exposure process using a Canon exposure system will be briefly described.

FIG. 1A is a schematic perspective view illustrating a general optical exposure system.

Referring to FIG. 1A, the optical exposure system includes a mask 10 having patterns to be projected on a substrate, a light source 20 having a slit and a bent shape, a large mirror 30, a concave mirror 40, a convex mirror 50 and a plate 60 on which the substrate is to be mounted.

A light generated from the light source 20 passes through the mask 10 while the light source 20 is moved in a direction of scanning. The light passes through the large mirror 30, the concave mirror 40 and the convex mirror 50 in sequence to transcribe patterns of the mask 10 at the substrate.

FIG. 1B is a plan view illustrating an arrangement of the plate and the mask of FIG. 1A.

Referring to FIG. 1B, through the mask 10 in which two cells are arranged, the light source 20 projects the patterns of the mask to the cells with bent shape scanning. The improvement of process yield can be achieved by arranging as many cells as possible in a mask.

Generally, a misalignment occurs during the exposure process, even for an accurate exposure system. In particular, when the pixel electrode and the data line are formed on different layers, the interval between the pixel electrode and the data line may be deviated from a designed value due to separate exposure processes. Thus, a coupling capacitance between the data line and the pixel electrode through the insulation layer becomes different from the designed value. In addition, the interval between the pixel electrode and the data line becomes irregular. Thus, even when substantially same gray scale voltage is applied to the pixel electrode, the interval between the pixel electrode and the data line varies.

When a stepper is used as the exposure system, one display region is divided into several blocks and then each of the blocks is exposed in sequence. Thus, each block may have a different size of interval between the data line and the pixel electrode one another. Thus, the light that passes though each block has different luminance resulting in stitch defect with chessboard pattern.

When an aligner is used as the exposure system, a misalignment between layers occurs to cause defects of the display device. These defects of the display device are observed as vertical lines and called as vertical line shaped blot.

FIGS. 2A and 2B are plan views illustrating pattern size variations caused by a misalignment between a data line and a pixel electrode in a cell. In FIG. 2A, twelve measuring points are shown for example, and in FIG. 2B, pattern sizes corresponding to each measuring point of FIG. 2A are shown.

Referring to FIGS. 2A and 2B, the size of the intervals between the data line and the pixel electrode may be varied according to the measuring points. These differences in intervals cause the difference in coupling capacitance between the data line and the pixel electrode to show the vertical line shaped blot and variations in luminance.

One of the methods for reducing variation ranges of the coupling capacitance is amending the coordinates of the exposure system in consideration of the size of the intervals between the pixel electrode and the data line, which is formed already. In practice, the intervals between the pixel electrode and the data line are controlled within allowable values using the method explained above.

Korean Patent Laid Open publication No. 1999-81025 discloses a method of detecting intervals between a pixel electrode and a data line Korean Patent Laid Open Publication No. 1999-41951 discloses a method of forming a source electrode and a pixel electrode together to reduce the difference in coupling capacitance between the data line and pixel electrode caused by the misalignment during the exposure process using stepper.

Recently, as the substrate becomes larger, a cell corresponding to the maximum exposure area of the mask is exposed during the exposure process. Currently, there is no solution for the problems of the vertical line caused by the misalignment of layers in the cell. Thus, as the glass substrate becomes larger, the misalignment of layers induces lowering of productivity.

SUMMARY OF THE INVENTION

Accordingly, the present invention is provided to substantially obviate one or more problems due to limitations and disadvantages of the related art.

The present invention provides a method of exposing a layer with a light that reduces a defect of a display device.

The present invention also provides a method of manufacturing a thin film transistor substrate using the method of exposing the layer with the light that reduces defect that corresponds to vertical lines, and improves product yields.

According to an exemplary method of the present invention, a mask including a pattern shape is disposed over a layer formed on a substrate. The mask is scanned with a light such that a direction of the scanning is substantially perpendicular to a longitudinal direction of the pattern shape to form a pattern.

The method is applied when a difference in capacitance is generated due to the coupling between the pattern and a conductive pattern that is disposed in a different layer from the pattern through an insulation layer. For example, the pattern corresponds to a data line.

The method can also be employed during the exposure process for forming a pixel electrode as the conductive pattern after forming the insulation layer on the data line. Here, a direction of scanning is substantially perpendicular to the longitudinal direction of the data line. The method is preferably used for manufacturing a liquid crystal display device having a size of seventeen or more inches where a failure due to the misalignment frequently occurs.

According to an exemplary method of manufacturing a thin film transistor substrate for a liquid crystal display device, a gate wiring layer is formed on a substrate, and the gate wiring layer is etched to form a gate wiring. The gate wiring includes a gate line, a gate end and a gate electrode. A gate insulation layer is formed on the substrate having the gate wiring formed thereon, and a semiconductor layer pattern and an ohmic contact layer pattern are sequentially formed on the gate insulation layer. A data wiring layer is formed on the substrate having the semiconductor layer pattern and the ohmic contact layer pattern, and a photoresist layer is formed on the data wiring layer. A mask including a pattern shape is disposed over the photoresist layer formed on the substrate and the mask is scanned with a light, such that a direction of the scanning is substantially perpendicular to a longitudinal direction of the pattern shape to expose the photoresist layer.

The data wiring layer is patterned using the exposed photoresist layer to form a data wiring. The data wiring includes a data line crossing the gate line, a data end connected to the data line, a source electrode connected to the data line and adjacent to the gate electrode, and a drain electrode in an opposite position to the source electrode around the gate electrode. A protection layer is formed on the substrate having the source and the drain electrode formed thereon, and the gate insulation layer and the protection layer are patterned to form contact holes. The contact holes expose the gate end, the data end and the drain electrode, respectively. A transparent conductive layer is formed, and the transparent conductive layer is etched to form an auxiliary gate end, an auxiliary data end and a pixel electrode thereby completing a thin film transistor substrate for a liquid crystal display device. The auxiliary gate end is connected to the gate end, and the auxiliary data end is connected to the data end. The pixel electrode is connected to the drain electrode.

When exposing the photoresist layer for forming the pixel electrode, the direction of scanning is preferably perpendicular to the longitudinal direction of the data line.

The mask may expose one cell at once. Alternatively, the mask may expose two cells at once.

According to an exemplary method of manufacturing a thin film transistor substrate for a liquid crystal display device, a gate wiring layer is formed on a substrate, and the gate wiring layer is etched to form a gate wiring. The gate wiring includes a gate line, a gate end and a gate electrode. A gate insulation layer is formed on the substrate having the gate wiring formed thereon. A semiconductor layer, an ohmic contact layer and a conductive layer are sequentially formed on the gate insulation layer. A photosensitive layer pattern is formed by scanning with light through a mask. A direction of scanning is substantially perpendicular to a longitudinal direction of a data line to be formed during an exposure process, and the photosensitive layer pattern includes a first portion, a second portion thicker than the first portion, and a third portion thinner than the first portion. A data wiring including a data line, a data end connected to the data line, a source electrode and a drain electrode, an ohmic contact layer pattern and a semiconductor layer pattern are formed using the photosensitive layer pattern as a mask. A protection layer is formed, and the protection layer and the gate insulation layer are patterned to form contact holes. The contact holes expose the gate end, the data end and the drain electrode, respectively. A transparent conductive layer is formed, and the transparent conductive layer is etched to form an auxiliary gate end, an auxiliary data end and a pixel electrode, thereby completing a thin film transistor substrate for a liquid crystal display device. The auxiliary gate end is connected to the gate end, and the auxiliary data end is connected to the data end. The pixel electrode is connected to the drain electrode.

When exposing the photoresist layer for forming the pixel electrode, the direction of scanning is preferably perpendicular to the longitudinal direction of the data line.

The mask may expose one cell or two cells at once.

Preferably, the first portion is located between the source electrode and the drain electrode, and the second portion is located on the data wiring.

According to the present invention, during the exposure process, by making the direction of scanning substantially perpendicular to the data line, the alignment margins between the data line and the pixel electrode increase, thereby reducing the variance in coupling capacitances between them and reducing failures in the vertical lines.

BRIEF DESCRIPTION OF THE DRAWINGS

The above and other features and advantages of the invention will become more apparent by describing in detailed exemplary embodiments thereof with reference to the accompanying drawings, in which:

FIGS. 2A and 2B are plan views illustrating pattern size variations caused by a misalignment between a data line and a pixel electrode in a cell;

DESCRIPTION OF THE PREFERRED EMBODIMENTS

Hereinafter the preferred embodiment of the invention will be described in detail with reference to the accompanying drawings.

As the liquid crystal display (LCD) device becomes larger and has higher resolution, a vertical line shaped blot occurs more often. More serious blot appears in the patterned vertical alignment (PVA) mode LCD than in the twisted nematic (TN) mode LCD. The PVA mode LCD has a high contrast ratio and a wide viewing angle. A simulation of a vertical line margin according to the shift between layers was performed on a nineteen inches PVA mode LCD so as to find out the biggest cause of the vertical line shaped blot. It was found that a main factor generating the vertical line shaped blot is a coupling between a data line and a pixel electrode.

To find out the reason why the PVA mode LCD has more vertical line shaped blots than the TN mode LCD, comparative simulation was performed by using a nineteen inches PVA mode LCD and a seventeen inches TN mode LCD. The gray scale level in which the vertical line shaped blots are visible is 60 gray/256 gray in case of the nineteen inches PVA mode LCD, and 40 gray/256 gray for the seventeen inches TN mode LCD, with |Vd|4.6V and 6.9V, respectively.

The results are represented in the following Table 1.

TABLE 1

|  | 19″ E21(PVA) | 17″ EM5(TN) |  |
|---|---|---|---|
| gray scale of failure | 60 gray/ 256 gray | 40 gray/ 256 gray |  |
| transmittance at gray scale of failure | 5% | 1% | based on white (100%) |
| |Vd| | 4.6 V | 6.9 V | |Vd| = 2*Vlc |
| 1 gray scale voltage | 8 mV/1 g | 22.5 mV/1 g | based on gray scale of failure |

At each gray scale of failure of 2 modes, the difference in 1 gray scale voltages arises from the following reasons.

The vertical line is detected more at a lower gray scale area that is a little brighter than background regions due to TN-PVA dependability. This is because the voltage of the PVA mode LCD is changed more rapidly than that of the TN mode LCD in terms of V-T steepness. The relationship is shown as graphs in the following drawings.

Figure 3A:
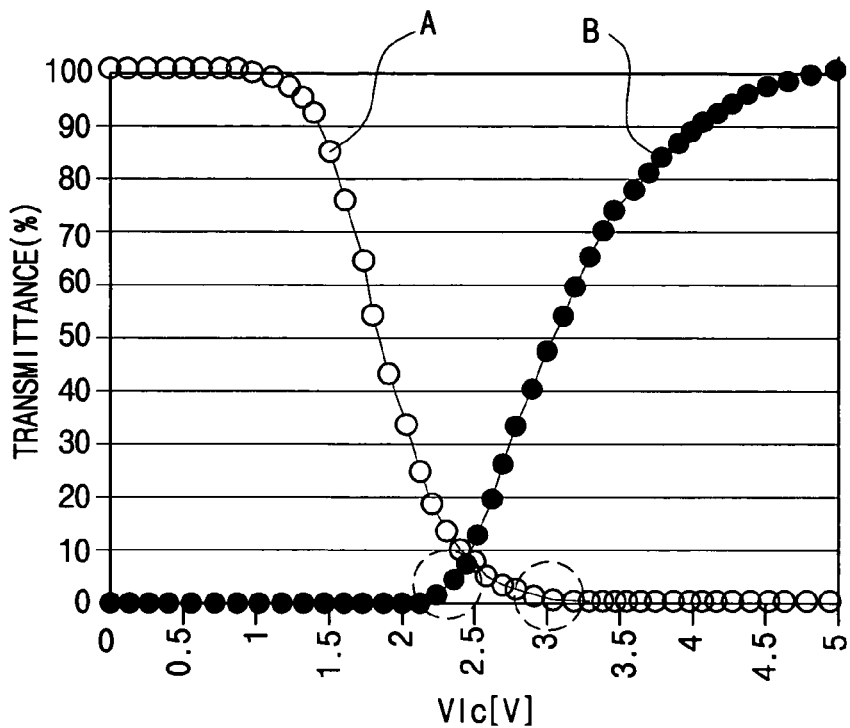
FIG. 3A represents graphs illustrating the relationship between the voltages of liquid crystal and the transmittances of devices in a seventeen inches TN mode LCD and a nineteen inches PVA mode LCD.

FIG. 3A represents graphs illustrating the relationship between the voltages of liquid crystal and transmittances of devices in the seventeen inches TN mode LCD and the nineteen inches PVA mode LCD.

Figure 3B:
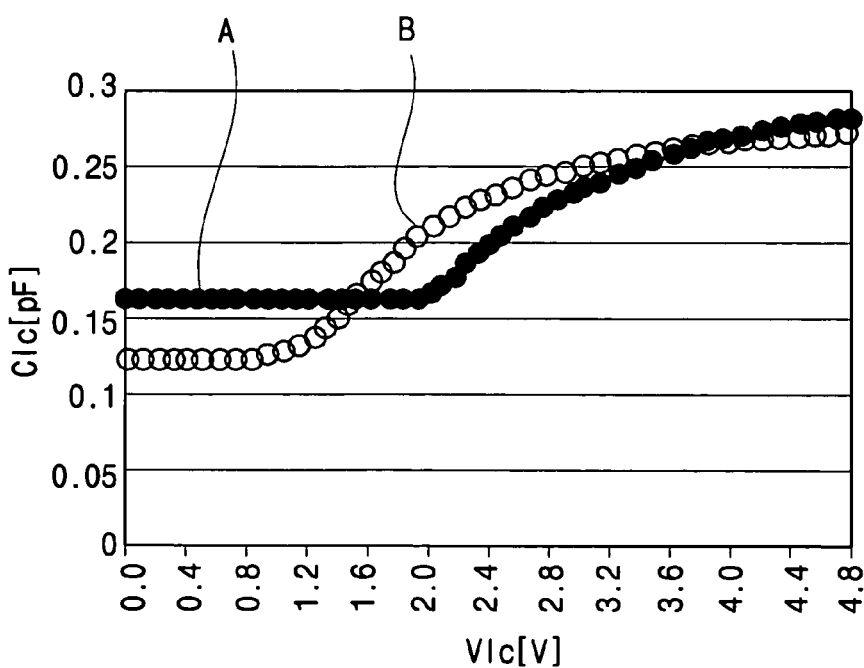
FIG. 3B represents graphs illustrating the relationship between the voltages and the capacitances of liquid crystal in a seventeen inches TN mode LCD and a nineteen inches PVA mode LCD.

FIG. 3B represents graphs illustrating the relationship between the voltages and the capacitances of liquid crystal in the seventeen inches TN mode LCD and the nineteen inches PVA mode LCD.

In FIGS. 3A and 3B, graph A corresponds to the seventeen inches TN mode LCD, and graph B corresponds to the nineteen inches PVA mode LCD.

Referring to FIG. 3A, graph B is steeper than graph A when comparing the circled portions. In the PVA mode LCD, the transmittance is greatly changed by a small change of the voltage. Also, the luminance is greatly changed by a small change of the voltage causing failures.

Also, in FIG. 3B, graph B is steeper than graph A. Thus the liquid crystal capacitance is greatly changed by a small change of the voltage in the PVA mode LCD.

In the TN mode LCD, when a voltage is not applied, white mode is represented. When a voltage is applied, black mode is represented. In the black mode, the variation of luminance due to a small variation of the voltage is not easily detected.

On the other hand, in the PVA mode, when voltage is not applied, black mode is represented. When a voltage is applied, white mode is represented. Accordingly, in the white mode, the luminance is greatly changed by a small variation of the voltage.

The misalignment between the data line and the pixel electrode is a major reason for the variation of the coupling capacitance. This occurs more often when the direction of scanning is the same as the longitudinal direction of the data line. This is because the alignment margin between the data line and the pixel electrode is small. This is also because the exposure system is weak at stage vibration and fly-eye focusing scattering in the direction of scanning. Thus, the relation between the direction of scanning and the longitudinal direction of the data line becomes important. In the nineteen inches LCD that has a large cell and uses as wide exposure area of the expose device as possible, the alignment between the data line and the pixel electrode in the cell needs to be controlled. For this, the direction of scanning needs to be perpendicular to the longitudinal direction of the data line.

Figure 4A:
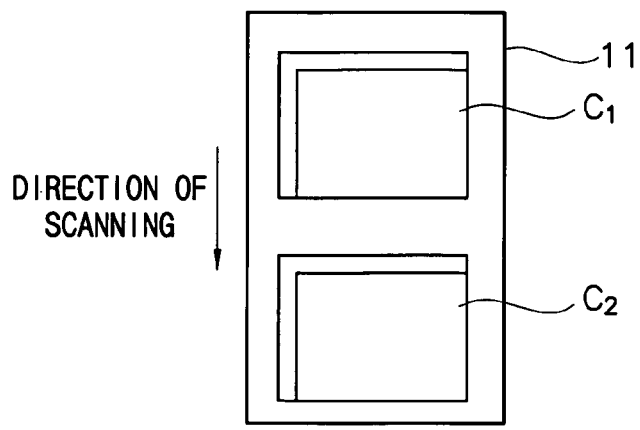
FIGS. 4A to 4C are plan views illustrating an arrangement of masks along a direction of scanning.
Figure 4B:
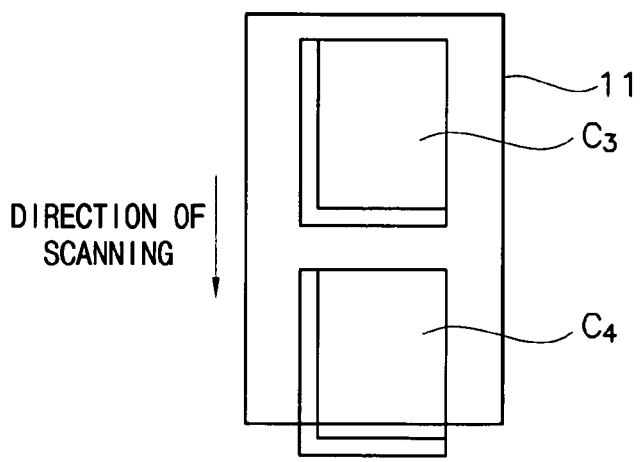
Figure 4C:
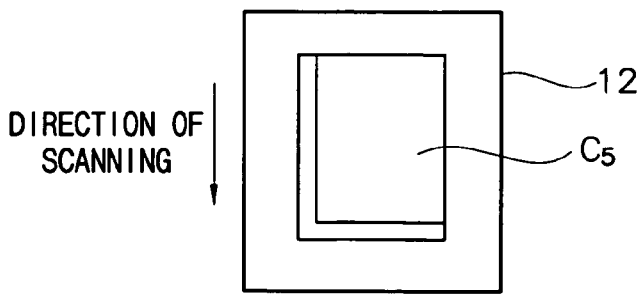

FIGS. 4A to 4C are plan views illustrating an arrangement of masks along the direction of scanning.

Figure 1A:
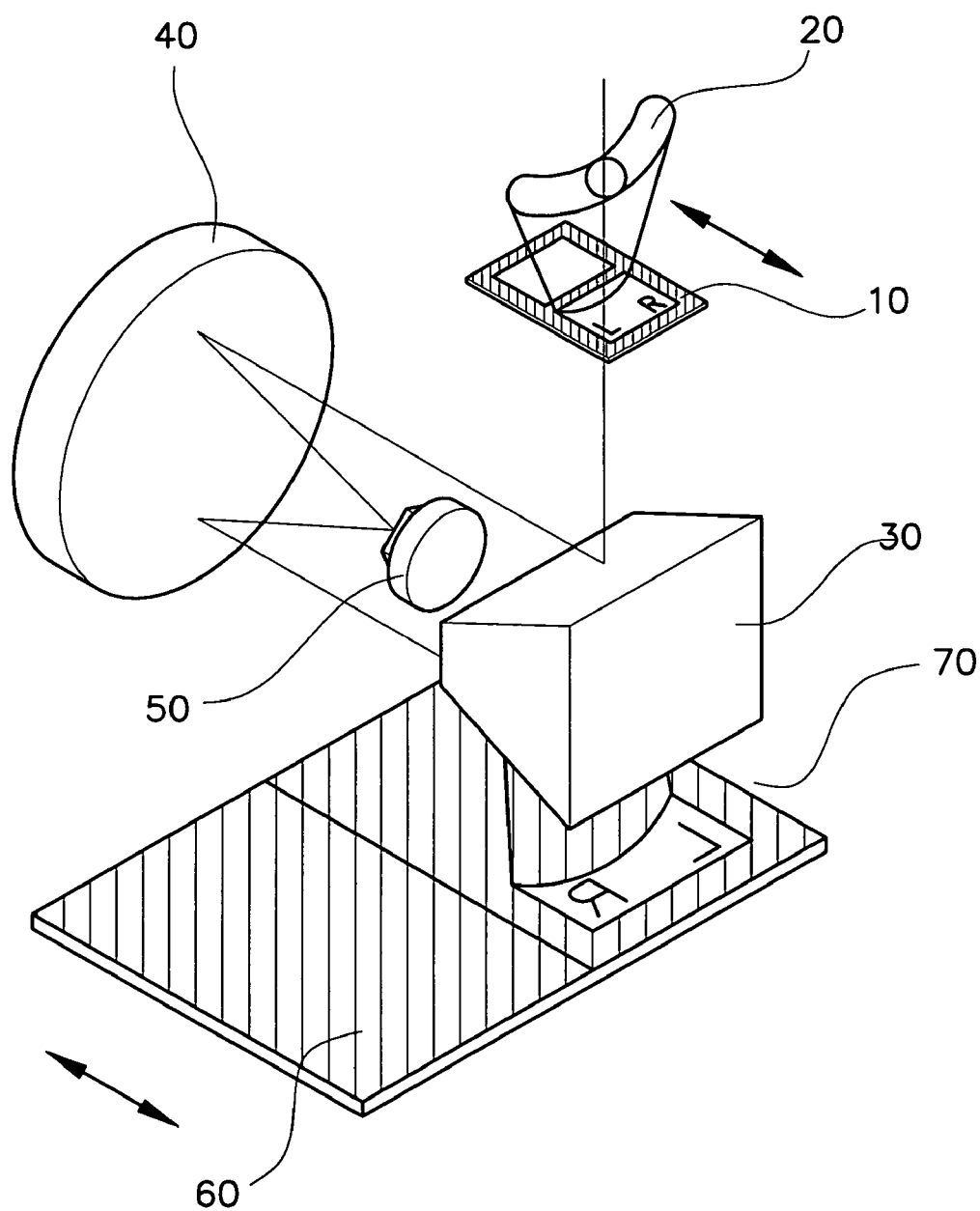
FIG. 1A is a schematic perspective view illustrating a general optical exposure system.
Figure 1B:
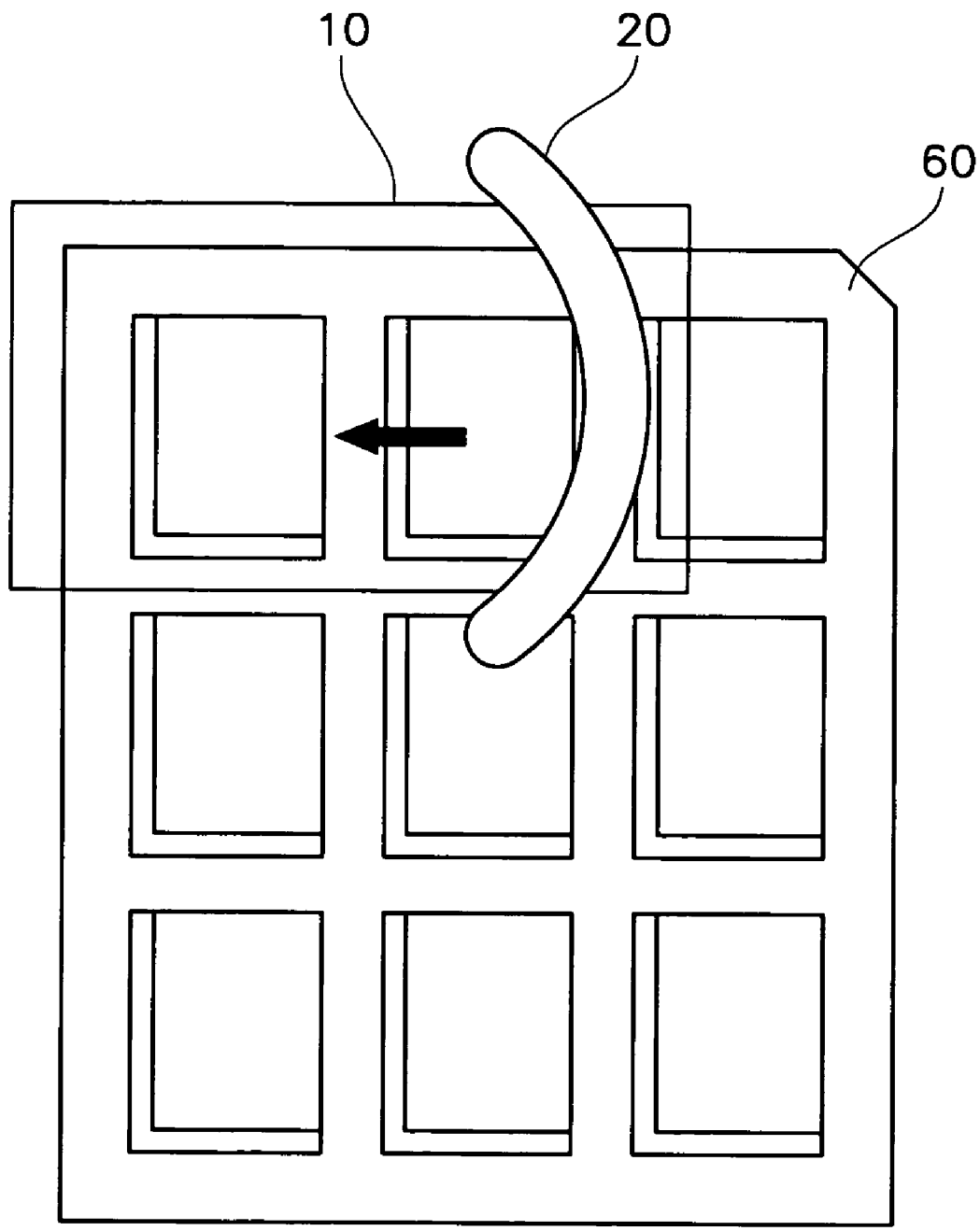
FIG. 1B is a plan view illustrating an arrangement of the plate and the mask of FIG. 1A.

FIG. 4A illustrates the process that disposes two cells c1 and c2 under a long mask 11. As shown in FIG. 1B, in the nineteen inches PVA mode LCD that requires reduced failures in the vertical lines, two cells are disposed under the long mask in order to increase a tact time during the expose process. In this process, however, failures in the vertical lines are likely to be generated, because the longitudinal direction of the data line and the direction of scanning are substantially identical.

As a result, as shown in FIG. 4B, two cells c3 and c4 are preferably arranged under the long mask 11 and the direction of scanning is substantially perpendicular to the longitudinal direction of the data line. In practice, however, it is impossible to arrange two cells under the long mask 11, because the cells are arranged in the longitudinal direction of the data line.

Hence, as shown in FIG. 4C, one cell c5 is disposed under a standard mask 12 while the direction of scanning is substantially perpendicular to the longitudinal direction of the data line.

According to the present invention, the standard mask is employed because the long mask may not be used when the direction of scanning is substantially perpendicular to the longitudinal direction of the data line. Here, only one cell is disposed under the standard mask so that the process yield of the photolithography process is reduced. Thus, the standard mask is used only when a layer that is likely to generate failures in the vertical line is formed. Namely, the standard mask is used when a data line or a pixel electrode is formed. When forming a gate line, activation layer or protection layer that does not affect the failures in the vertical lines, the long mask is used since the exposure process is performed regardless of the direction of scanning (mix and match).

Another method of increasing the alignment margin between the data line and the pixel electrode has been developed for reducing failures in the vertical lines. In order to reduce failures in the vertical lines of the nineteen inches PVA mode LCD as low as seventeen inches TN mode LCD, the following factors should be considered.

As described above, when the data line and pixel electrode overlay is shifted by about 1 μm due to the differences of V-T steepness at the gray scale that causes failures, the variations of luminance in the nineteen inches PVA mode LCD is greater than that in the seventeen inches TN mode LCD. Thus, the failures in the vertical lines are easily detected. Table 2 and FIG. 5 illustrate the variations of luminance at the gray scale of failure.

TABLE 2

| | 19" E21 (PVA) | 17" EM5 (TN) | |
|---|---|---|---|
| gray scale of failure | 60 gray/ 256 gray | 40 gray/ 256 gray | |
| variations of luminance when data line-pixel electrode overlay is shifted by about 1 μm | 1.6 | 1.17 | Process Capability needs to be controlled from 1 μm to 0.7 μm |

Figure 5:
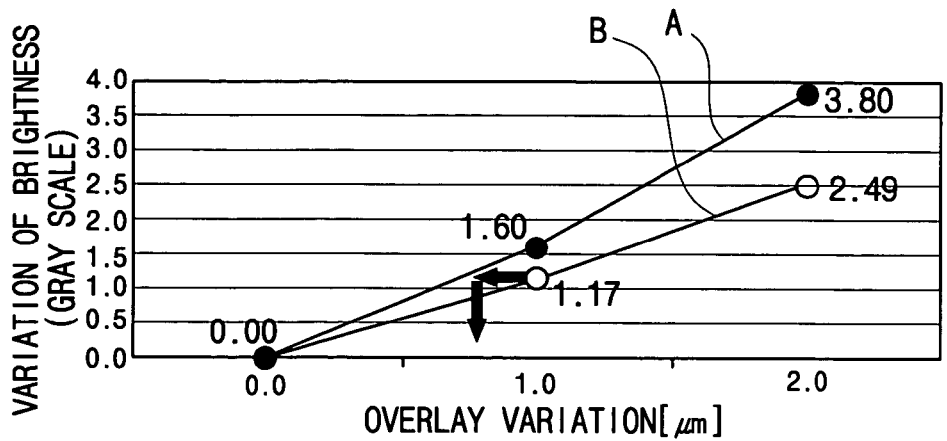
FIG. 5 represents graphs illustrating a variation of luminance according to the overlay shift between a data line and a pixel electrode.

FIG. 5 represents graphs illustrating the variation of the luminance according to the overlay shift between the data line and the pixel electrode. Graph A corresponds to the nineteen inches PVA mode LCD, and graph B corresponds to the seventeen inches TN mode LCD. It is noted that the process capability of the overlay needs to be controlled from 1 μm to 0.7 μm in order to reduce the variations of the luminance of the nineteen inches PVA mode LCD to the level of the seventeen inches TN mode LCD.

The coupling capacitance varies according to the data line width in the nineteen inches PVA mode LCD. For example, the LCD whose data line width is about 6 μm has the interval between the data line and pixel electrode of about 5.0 μm, whereas the LCD whose data line width is about 7 μm has the interval of about 4.5 μm in an after cleaning inspection (ACI). This controlling of the width improves the gray scale by about 0.3 gray.

Figure 6:
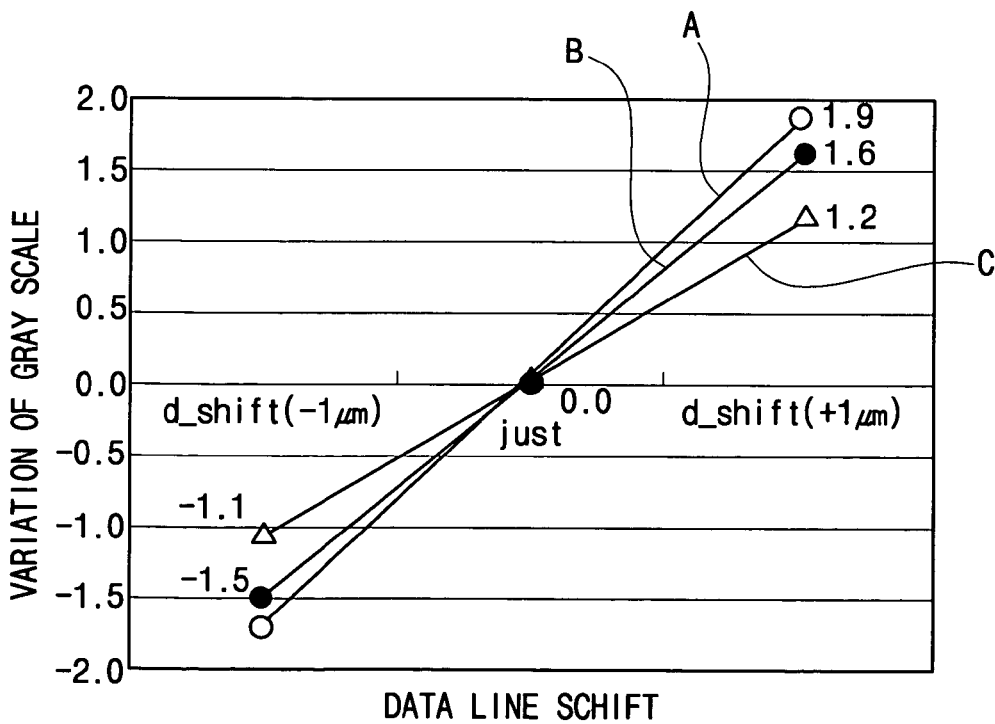
FIG. 6 are graphs illustrating variations of a gray scale according to the data line shift in a nineteen inches PVA mode LCD and a seventeen inches TN mode LCD.

FIG. 6 are graphs illustrating the variations of the gray scale according to the data line shift in the nineteen inches PVA mode LCD and the seventeen inches TN mode LCD.

In FIG. 6, graph A corresponds to a PVA mode LCD having about 4.5 μm of interval between the data line and the pixel electrode. Graph B corresponds to a PVA mode LCD having about 5.0 μm of interval. Graph C corresponds to a TN mode LCD having the interval of about 4.5 μm.

It can be noted that the variations of the gray scale according to the data line shift are greater in the PVA mode LCD than in the TN mode LCD. It is also noted that the variations of the gray scale according to the data line shift become greater as the interval between the data line and the pixel electrode becomes smaller in the PVA mode LCD. Hence, it is preferable to keep the interval as wide as possible.

When the interval between the data line and the pixel electrode increases, the numerical aperture is reduced. Thus, the interval may not be reduced as much as wanted. It is important to set an optimal margin of the interval.

Figure 7:
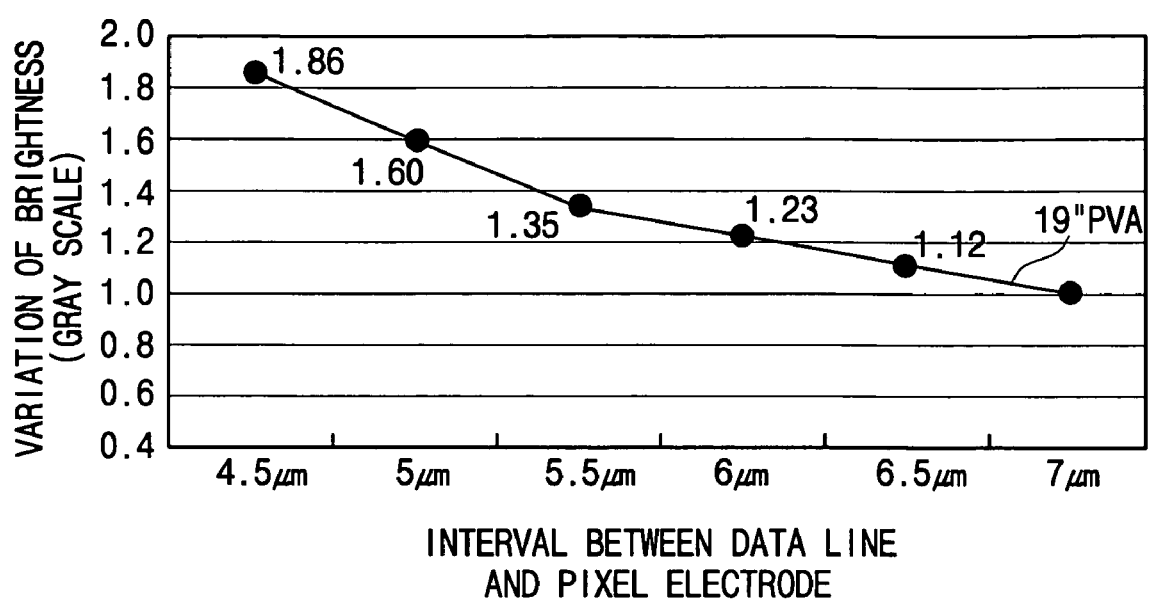
FIG. 7 is a graph illustrating the variation of luminance according to the interval between a data line and a pixel electrode when overlay varies by about 1 μm.

FIG. 7 is a graph illustrating the variation of the luminance according to the interval between the data line and the pixel electrode when overlay varies by about 1 μm.

When the process capability is controlled by about 1 μm scale and the overlay between the data line and the pixel electrode was shifted by about 1 μm, the variation of the luminance is simulated according to the interval between the data line and the pixel electrode. When the interval is 6.5 μm, the variation of the luminance of the seventeen inches TN mode LCD is at most 1.17. In the nineteen inches PVA mode LCD, the transmittance is reduced by about 0.2% from 4.3% (color reproductivity 65%). As shown in FIG. 7, the optimal interval in the PVA mode having similar variations of the luminance with the TN mode LCD is determined to be about 6.25 μm.

To reduce failures in the vertical lines, it is required to reduce the coupling capacitance between the data line and the pixel electrode. Thus, the direction of scanning should be substantially perpendicular to the longitudinal direction of the data line during the exposure process. Moreover, maintaining the interval between the data line and the pixel electrode to a desired level is necessary.

Hereinafter, the present invention will be described more fully with reference to the following examples.

Figure 8:
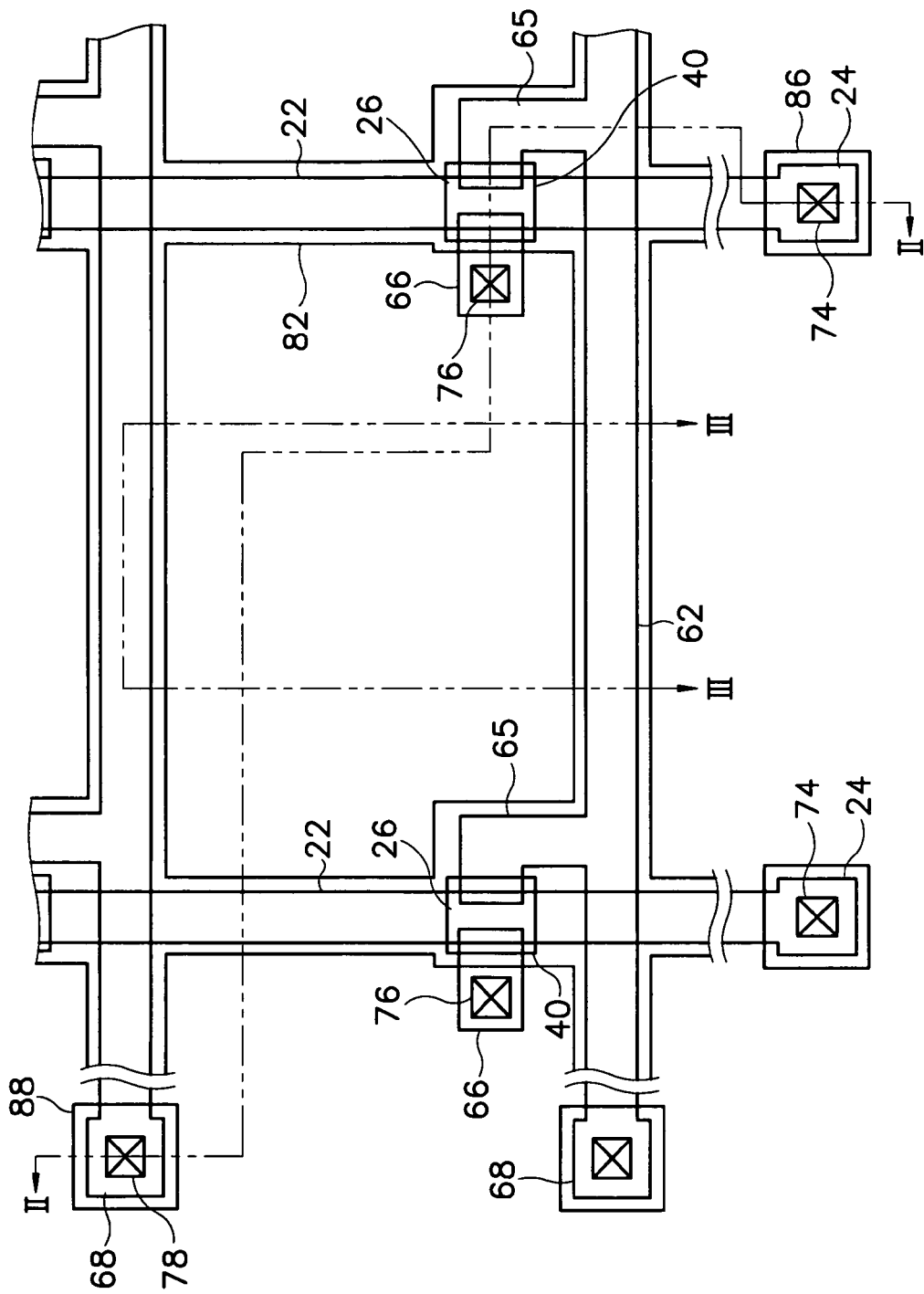
FIG. 8 is a plan view illustrating a thin film transistor substrate for a liquid crystal display device according to one embodiment of the present invention.
Figure 9:
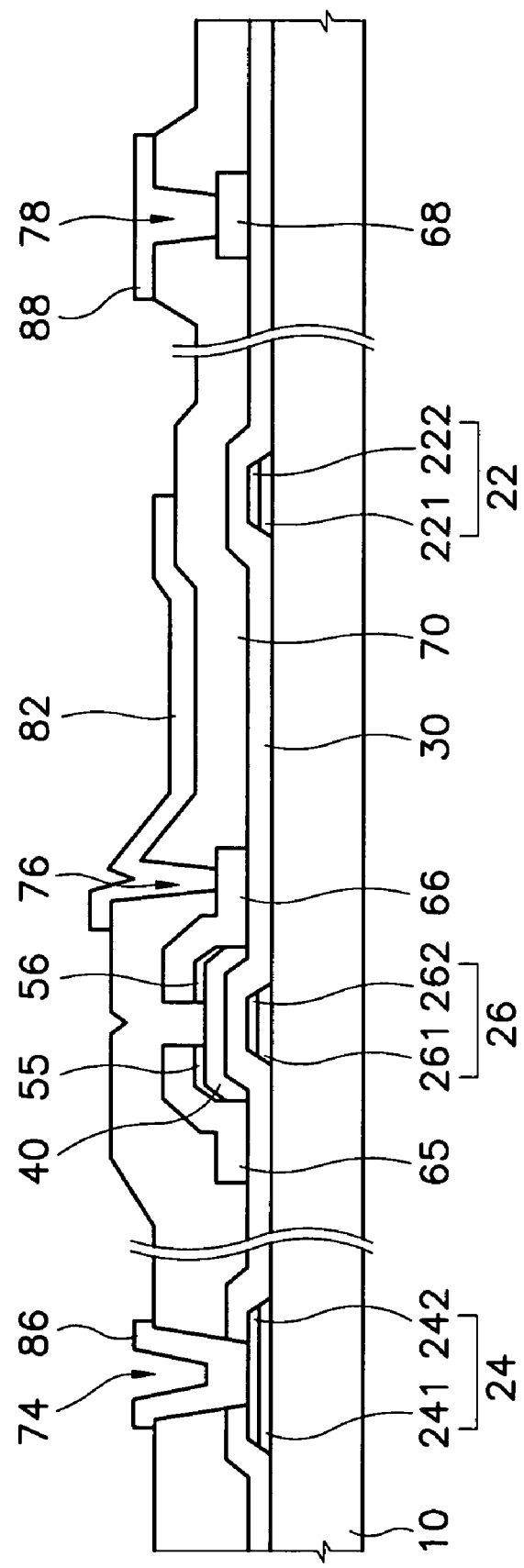
FIG. 9 is a cross-sectional view illustrating the thin film transistor substrate of FIG. 8 taken along a line II-II.
Figure 10:
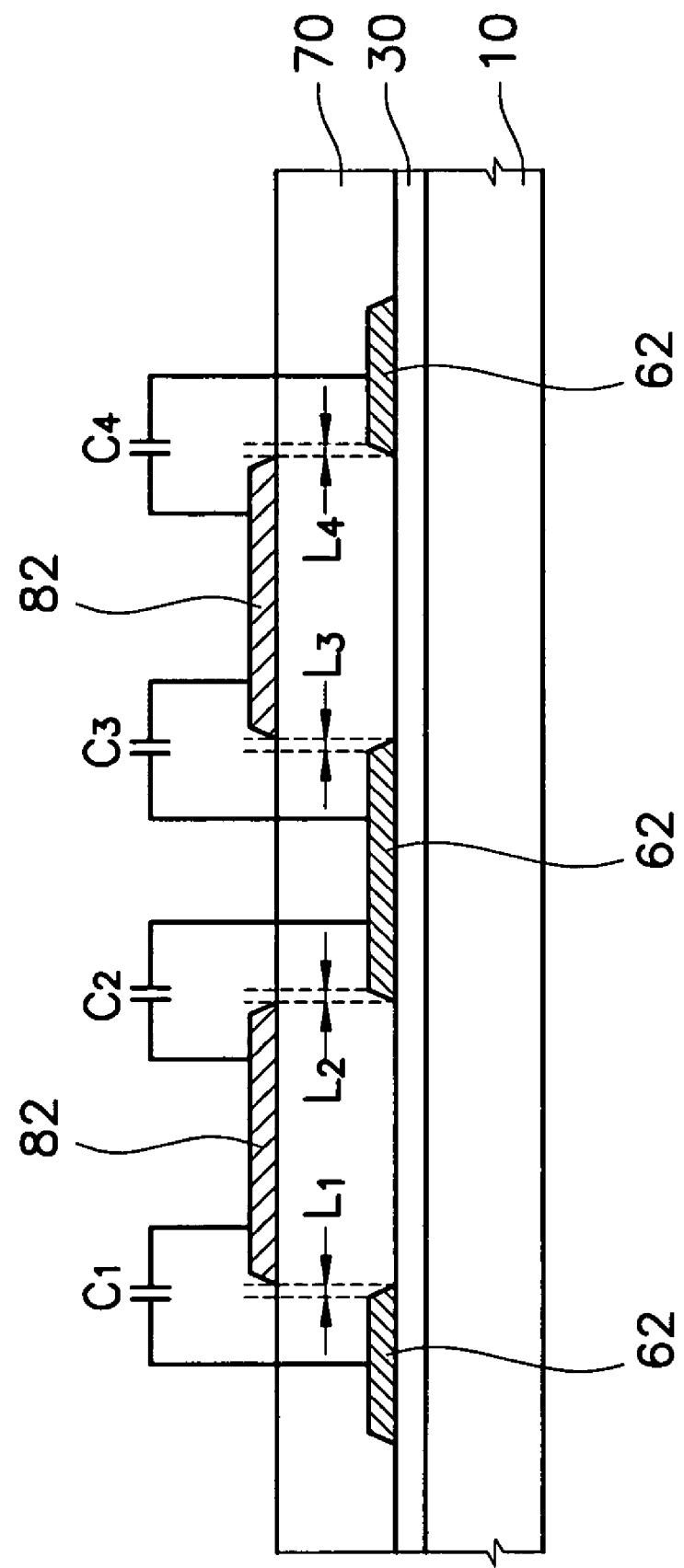
FIG. 10 is a cross-sectional view illustrating the thin film transistor substrate of FIG. 8 taken along a line III-III.

FIG. 8 is a plan view illustrating a thin film transistor substrate for a liquid crystal display device according to one embodiment of the present invention. FIG. 9 is a cross-sectional view illustrating the thin film transistor substrate of FIG. 8 taken along a line II-II. FIG. 10 is a cross-sectional view illustrating the thin film transistor substrate of FIG. 8 taken along a line III-III.

Referring to FIGS. 8 and 9, a gate wiring layer is formed on an insulation substrate 10 in a double layer including a first gate wiring layer and a second gate wiring layer. The first gate wiring layer includes chromium or aluminum-neodymium alloy, and the second gate wiring layer includes aluminum-neodymium alloy or molybdenum. The gate wiring layer is etched to form a gate wiring including a first gate wiring 221, 241 and 261 and a second gate wiring 222, 242 and 262. The gate wiring includes a gate line 22, a gate end 24 and a gate electrode 26. The gate line 22 extends in a longitudinal direction on the substrate 10, and the gate end 24 is connected to the end of the gate line 22. The gate end 24 receives a gate signal from outside and transmits the gate signal to the gate line 22. The gate electrode 26 for the thin film transistor is connected to the gate line 22.

A gate insulation layer 30 is formed on the substrate 10 overlying the gate wiring 22, 24 and 26. The gate insulation layer 30 includes silicon nitride (SiNx).

A semiconductor layer pattern 40 is formed on the gate insulation layer 30 over the gate electrode 26 in an island shape. The semiconductor layer pattern 40 includes amorphous silicon.

Ohmic contact layer patterns 55 and 56 are formed on the semiconductor layer pattern 40. The ohmic contact layer patterns 55 and 56 may include silicide or n+ hydrogenated amorphous silicon having highly doped n-type dopants.

A data wiring layer is formed on the ohmic contact layer patterns 55 and 56 and on the gate insulation layer 30. The data wiring layer is a double layer including a nickel-silicide layer and a second metallic layer. The data wiring layer is etched to form a data wiring.

The data wiring includes a data line 62, a source electrode 65, a data end 68 and a drain electrode 66. The data line 62 extends in a vertical direction and crossing the gate line 22 to define a pixel, and the source electrode 65 that is a branch of the data line 62 extends to an upper portion of the ohmic contact layer pattern 55. The data end 68 is connected to one end of the data line 62 and receives an image signal from outside, and the drain electrode 66 is separated from the source electrode 65 and is formed on an opposite upper portion of the ohmic contact layer pattern 56.

A protection layer 70 is formed on the data wiring and on the semiconductor layer pattern 40.

The first, second and third contact holes 74, 76 and 78 are formed in the protection layer 70. The second contact hole 76 exposes the drain electrode 66, and the third contact hole 78 exposes the data end 68. The first contact hole 74 exposes the gate insulation layer 30 and the gate end 24. The first and third contact holes 74 and 78 that expose the gate end 24 or the data end 68 may have an angular or circular shape.

A pixel electrode 82 is formed on the protection layer 70. The pixel electrode 82 is positioned in a pixel region and connected to the drain electrode 66 through the second contact hole 76.

An auxiliary gate end 86 and an auxiliary data end 88 are also formed on the protection layer 70. The auxiliary gate end 86 is connected to the gate end 24 through the first contact hole 74, and the auxiliary data end 88 is connected to the data end 68 through the third contact hole 78.

Each of the pixel electrode 82, auxiliary gate end 86 and auxiliary data end 88 includes indium zinc oxide (IZO) or indium tin oxide (ITO).

The pixel electrode 82 is separated from the data line 62 by a predetermined interval. Alternatively, the pixel electrode 82 may be superposed on the data line 62 to maximize a numerical aperture.

FIG. 10 illustrates the coupling capacitances between the data line 62 and the pixel electrode 82 of FIG. 9. Referring to FIG. 10, intervals between the data line 62 and the pixel electrode 82 are represented by L1, L2, L3 and L4, and the coupling capacitances according to the intervals are represented by C1, C2, C3 and C4. When the patterns are formed with precise intervals, all the intervals L1, L2, L3 and L4 are substantially identical, and all the coupling capacitances C1, C2, C3 and C4 are substantially identical. When the pattern intervals become irregular due to the misalignment during the exposure process, the coupling capacitance varies and failures in the vertical lines occur.

Hereinafter, a method of manufacturing a thin film transistor substrate for a liquid crystal display device according to one embodiment of the present invention will be described in detail with reference to FIGS. 8, 9 and 11 to 14.

Figure 11:
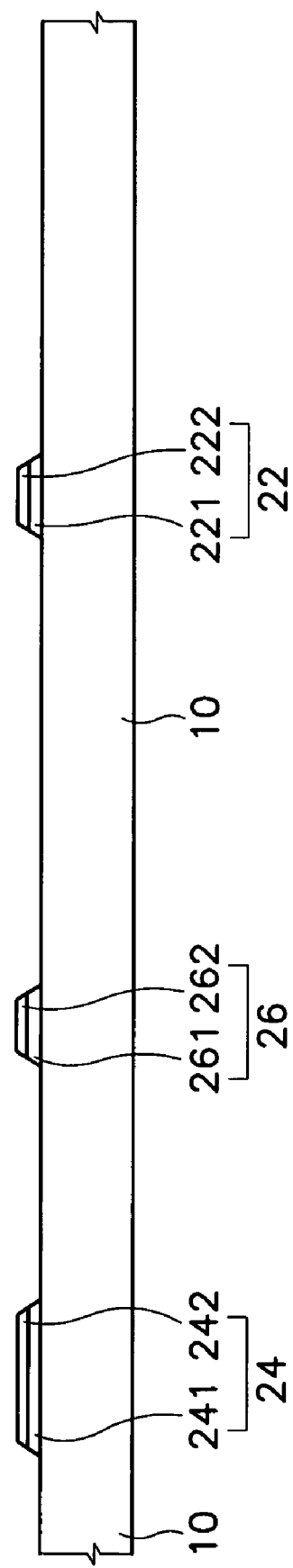
FIGS. 11 to 14 are cross-sectional views illustrating a method of manufacturing a thin film transistor substrate for the liquid crystal display device according to one embodiment of the present invention.

Referring to FIG. 11, a gate wiring layer is formed on an insulation substrate 10 in a double layer including a first gate wiring layer and a second gate wiring layer. The first gate wiring layer includes chromium or aluminum-neodymium alloy, and the second gate wiring layer includes aluminum-neodymium alloy or molybdenum.

A photoresist material whose solubility is changed when exposed to light is applied on the gate wiring layer to form a photoresist layer. A mask having patterns is interposed between the photoresist layer and an exposure system, and then the photoresist layer is exposed. During the exposure process, a direction of scanning is substantially perpendicular to a longitudinal direction of a gate line to be formed on the substrate 10. The exposed photoresist layer is developed to form a photoresist pattern. The gate wiring layer is patterned using the photoresist pattern as a mask, thereby forming a gate wiring including a first gate wiring 221, 241 and 261 and a second gate wiring 222, 242 and 262. The gate wiring extends to a longitudinal direction and includes a gate line 22, a gate electrode 26 and a gate end 24.

Figure 12:
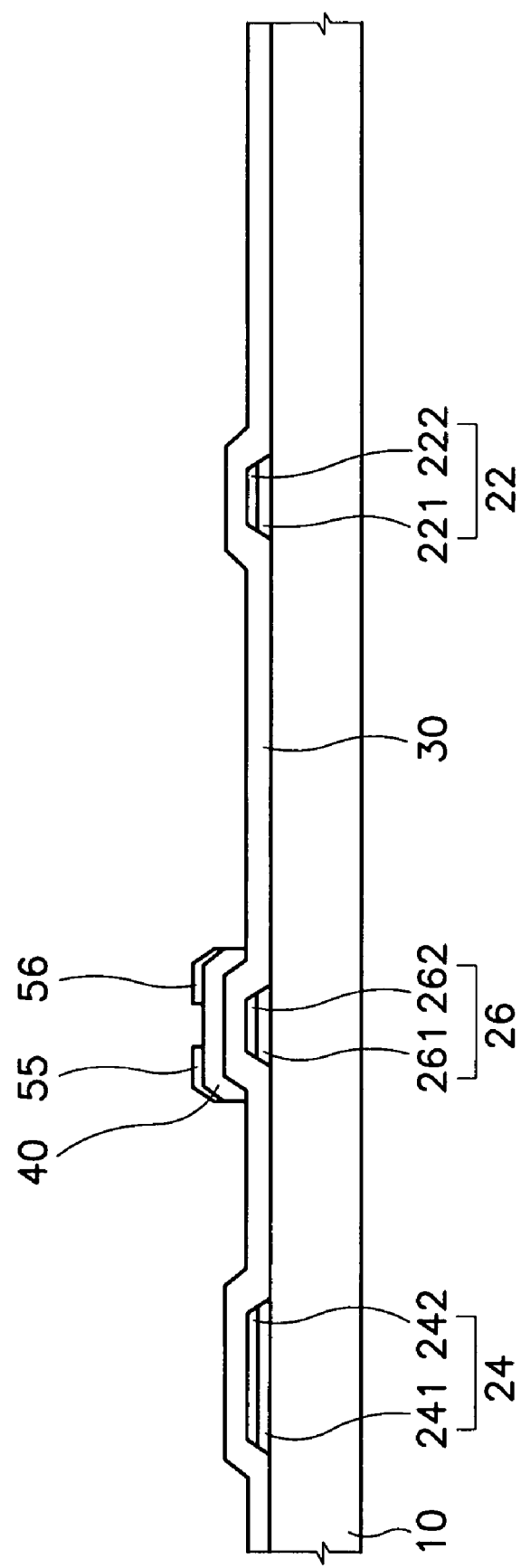

Referring to FIG. 12, a gate insulation layer 30 including silicon nitride, a semiconductor layer including amorphous silicon and a doped amorphous silicon layer are sequentially formed on the gate wiring. The semiconductor layer and the doped amorphous silicon layer are patterned or partially etched by a photolithography process to form a semiconductor layer pattern 40 in an island shape and ohmic contact layer patterns 55 and 56 on the gate insulation layer 30 over the gate electrode 24.

During the etching process, a direction of scanning is substantially perpendicular to the longitudinal direction of the gate line.

Figure 13:
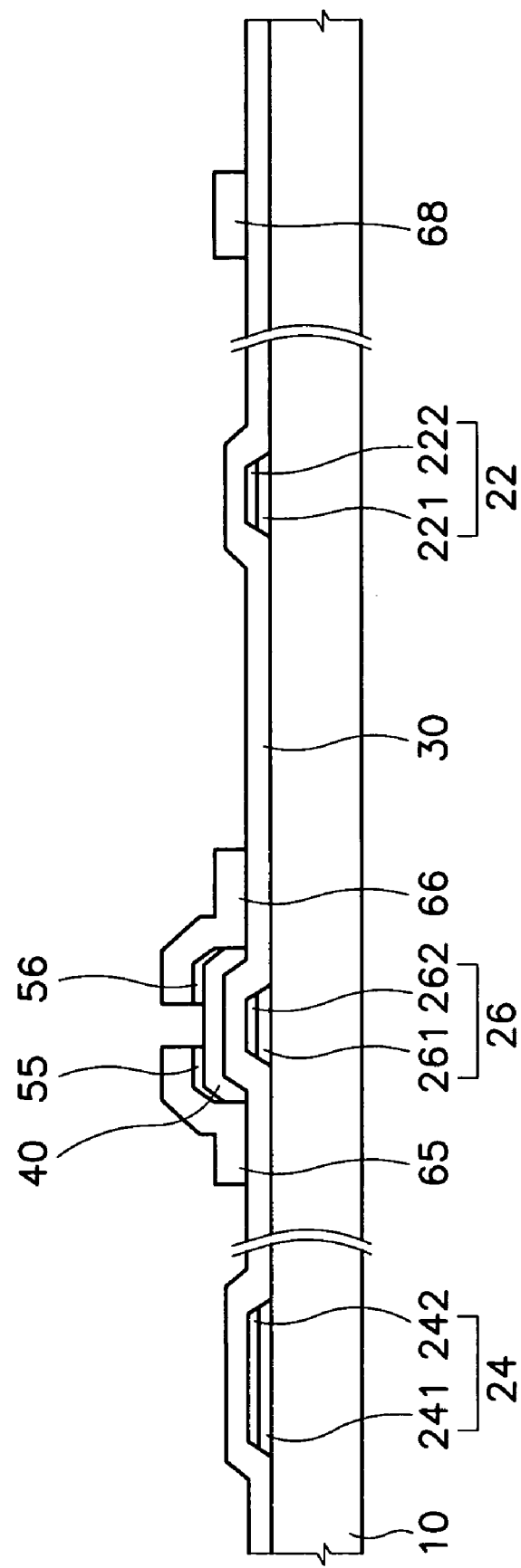

Referring to FIG. 13, a data wiring layer is formed on the ohmic contact layer patterns 55 and 56 and on the gate insulation layer 30. The data wiring layer includes molybdenum or molybdenum-tungsten alloy.

A photoresist material is applied on the data wiring layer and then dried to form a photoresist layer. The photoresist layer is exposed through a mask having patterns. During the exposure process, light is scanned over the substrate while a direction of scanning is substantially perpendicular to the longitudinal direction of data line. The exposed photoresist layer is developed to form a photoresist pattern.

The data wiring layer is then etched using the photoresist pattern as a mask to form a data wiring.

The data wiring includes a data line 62, a source electrode 65, a data end 68 and a drain electrode 66. The data line 62 crosses the gate line 22, and the source electrode 65 is connected to the data line 62 and adjacent to the gate electrode 26. The data end 68 is connected to the data line 62, and the drain electrode 66 in an opposite position to the source electrode 65 around the gate electrode 26.

Then, the ohmic contact layer pattern is separated around the gate electrode 26 by etching, and the semiconductor layer pattern 40 between the ohmic contact layer patterns 55 and 56 is exposed. The exposed semiconductor layer pattern 40 is preferably treated with oxygen plasma to be stabilized.

Figure 14:
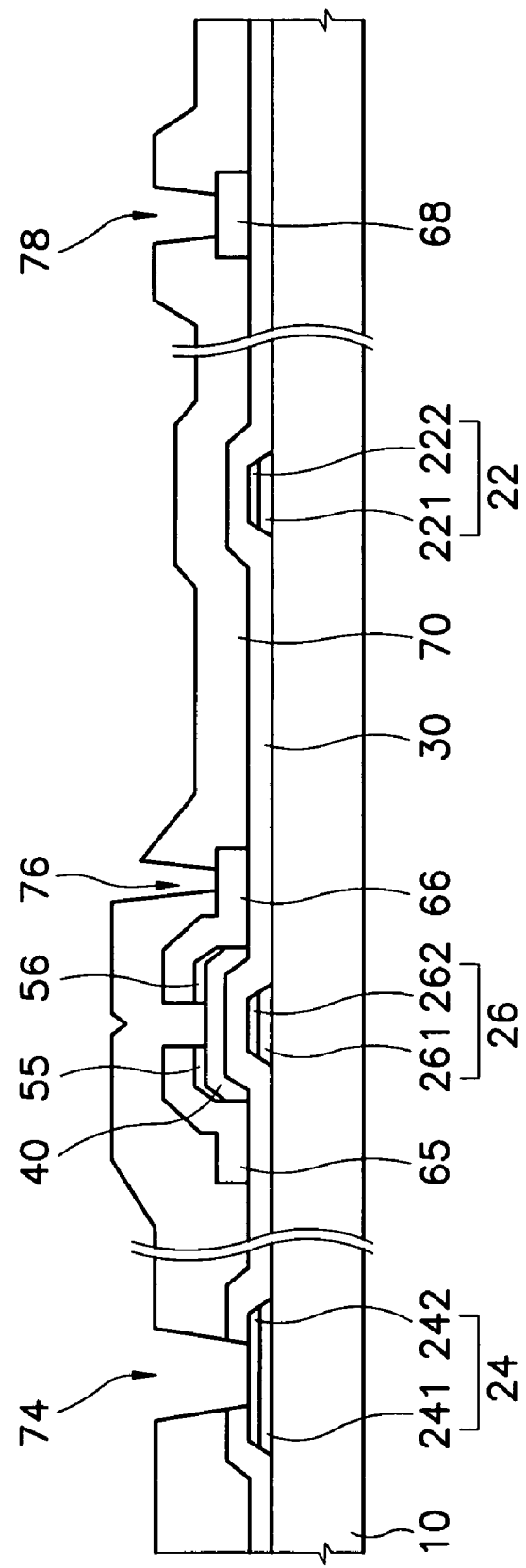

Referring to FIG. 14, a protection layer 70 is formed on the data wiring and on the semiconductor layer pattern 40. The protection layer 70 and the gate insulation layer 30 are patterned or partially etched by a photolithography process to form a first, second and third contact holes 74, 76 and 78. The first contact hole 74 exposes the gate end 24 and the second contact hole 76 exposes the drain electrode 66. The third contact hole 78 exposes the data end 68. The first, second and third contact holes 74, 76 and 78 may have an angular or circular shape.

Now referring to FIGS. 8 and 9, a transparent conductive layer is formed on the substrate by a deposition process. The transparent conductive layer may include indium zinc oxide (IZO) or indium tin oxide (ITO). The transparent conductive layer is then patterned by a photolithography process to form a pixel electrode 82, an auxiliary gate end 86 and an auxiliary data end 88.

The pixel electrode 82 is connected to the drain electrode 66 through a first contact hole 76. The auxiliary gate end 86 is connected to the gate end 24 through a second contact hole 74, and the auxiliary data end 88 is connected to the data end 68 through a third contact hole 78. During the etching process for forming the pixel electrode 82, a direction of scanning is preferably perpendicular to the longitudinal direction of the data line.

It is preferable to perform a pre-heating process before the deposition of ITO or IZO. The pre-heating process is preferably performed using a nitrogen gas. This prevents formation of a metal oxidation layer on the data end 24, on the drain electrode 66 and on the data end 68 that are respectively exposed by the first, second and third contact holes 74, 76 and 78.

The above described method may be applied to a method of manufacturing a thin film transistor substrate for the liquid crystal display device using 5 masks as well as to a method using 4 masks. This will be described in detail with reference to the drawings.

A unit pixel structure of a thin film transistor for a liquid crystal display device using 4 masks will be described in detail with reference to FIGS. 15 to 17.

Figure 15:
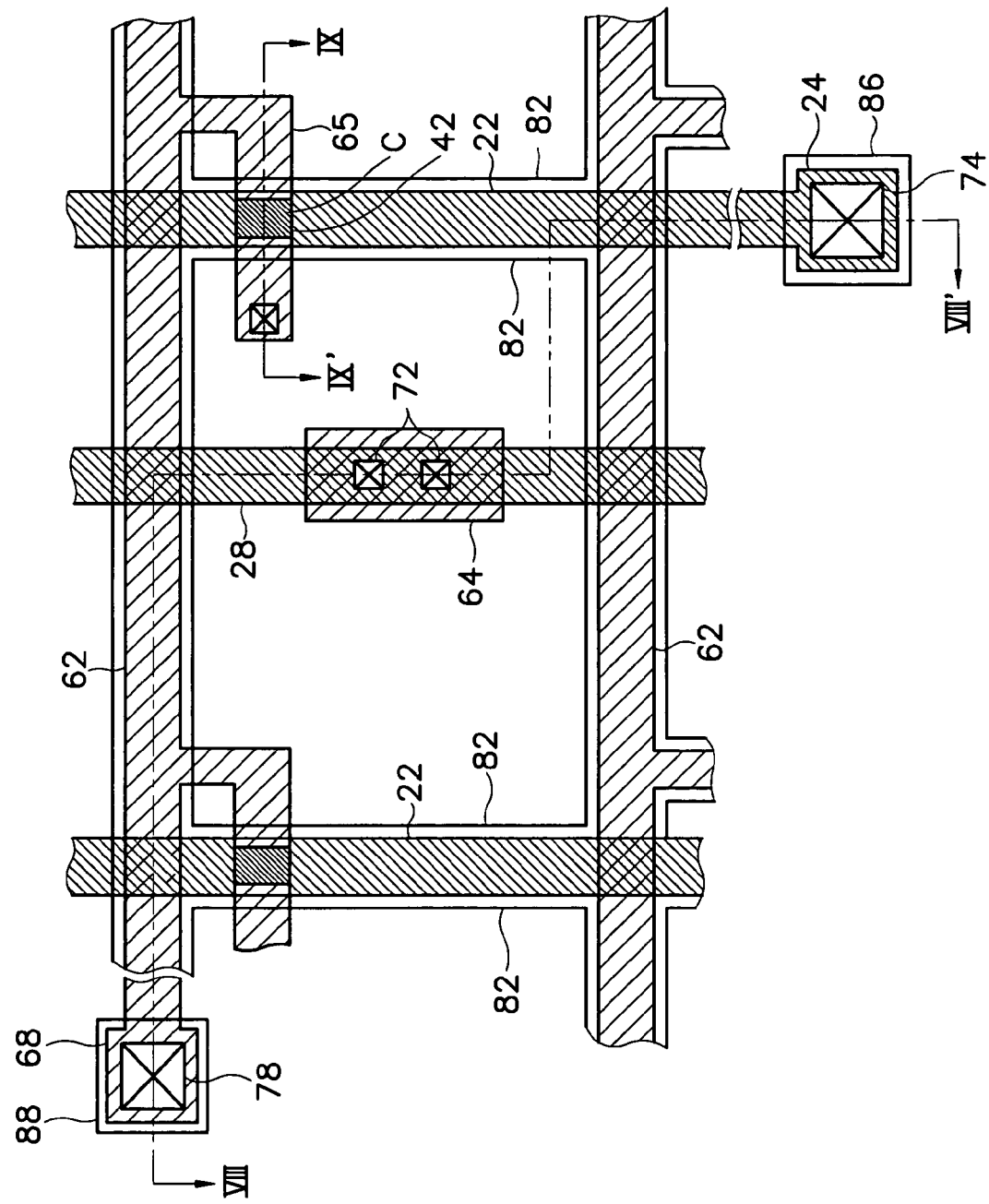
FIG. 15 is a layout illustrating a thin film transistor substrate for the liquid crystal display device according to another embodiment of the present invention.

FIG. 15 is a layout illustrating a thin film transistor substrate for a liquid crystal display device according to another embodiment of the present invention. FIG. 16 is a cross-sectional view illustrating the thin film transistor substrate of FIG. 15 taken along a line VIII-VIII'. FIG. 17 is a cross-sectional view illustrating the thin film transistor substrate of FIG. 15 taken along a line IX-IX'.

As described in the foregoing embodiment, a gate wiring layer is formed on an insulation substrate 10 in a double layer including a first gate wiring layer and a second gate wiring layer. The first gate wiring layer includes chromium or aluminum-neodymium alloy, and the second gate wiring layer includes aluminum-neodymium alloy or molybdenum. The gate wiring layer is etched to form a gate wiring including a first gate wiring 221, 241 and 261 and a second gate wiring 222, 242 and 262. The gate wiring includes a gate line 22, a gate end 24 and a gate electrode 26.

A maintaining electrode line 28 is formed on the substrate 10 in parallel with the gate line 22. The maintaining electrode line 28 includes a first gate wiring layer pattern 281 and a second gate wiring layer pattern 282. A gate insulation layer 30 is formed on the substrate 10 and on the maintaining electrode line 28 coving the gate wiring 22, 24 and 26. The gate insulation layer 30 includes silicon nitride (SiNx).

Semiconductor layer patterns 42 and 48 are formed on the gate insulation layer 30. The semiconductor layer patterns 42 and 48 include a semiconductor material such as hydrogenated amorphous silicon.

An ohmic contact layer pattern or intermediate layer pattern 55, 56 and 58 is formed on the semiconductor layer patterns 42 and 48. The ohmic contact layer pattern includes amorphous silicon doped with n-type impurities such as phosphorous (P).

Data wirings 62, 64, 65, 66 and 68 are formed on the ohmic contact layer patterns 55, 56 and 58. The data wirings may include nickel-silicide and a second metal material. The data wirings include data line portions 62, 65 and 68 having a data line 62, a source electrode 65 and a data end 68. The data line 62 extends in a vertical direction, and the source electrode 65 is a branch of the data line 62. The data end 68 is connected to one end of the data line 62 and receives an image signal from outside. The data wirings also include a drain electrode 66 that is separated from the data line portions 62, 68 and 65 and positioned on an opposite position of the source electrode 65 around the gate electrode 26 or the channel portion C of the thin film transistor. Additionally, the data wirings may include a conductive pattern for a maintaining condenser 64 positioned on the maintaining electrode line 28. When the maintaining electrode line 28 is not formed, the conductive pattern for the maintaining condenser 64 may not be formed either.

The ohmic contact layer patterns 55, 56 and 58 reduce the ohmic resistance between the semiconductor layer patterns 42 and 48 and the data wirings 62, 64, 65, 66 and 68. The ohmic contact layer patterns 55, 56 and 58 have a profile substantially identical to the underlying data wirings 62, 64, 65, 66 and 68. In other words, the ohmic contact layer pattern for the data line portion 55 has a profile substantially identical to the data line portions 62, 68 and 65. The ohmic contact layer pattern for the drain electrode 56 has a profile substantially identical to the drain electrode 66. The ohmic contact layer pattern for the maintaining condenser 58 has a profile substantially identical to the conductive pattern for the maintaining condenser 64.

The semiconductor layer patterns 42 and 48 have a shape substantially identical to the data wirings 62, 64, 65, 66 and 68 and the ohmic contact layer patterns 55, 56 and 58 except for the channel portion C of the thin film transistor. In particular, the semiconductor layer pattern for the maintaining condenser 48, the conductive pattern for the maintaining condenser 64 and the ohmic contact layer pattern for the maintaining condenser 58 have substantially identical shapes, but the semiconductor layer pattern 42 for the thin film transistor has different shapes from other portions of the data wiring and the ohmic contact layer pattern. At the channel portion C of the thin film transistor, the data line portions 62, 68 and 65, especially the source electrode 65 and the drain electrode 66 are separated, and the intermediate layer for the data line portion 55 and the ohmic contact layer pattern 56 for the drain electrode are separated. However, the semiconductor layer pattern 42 for the thin film transistor is connected to form the thin film transistor channel.

A protection layer 70 is formed on the data wirings 62, 64, 65, 66 and 68.

The protection layer 70 has contact holes 76, 78 and 72 each exposing the drain electrode 66, the data end 64 and the conductive pattern for the maintaining condenser 68. The protection layer 70 also has a contact hole 74 exposing the gate insulation layer 30 and the gate end 24.

A pixel electrode 82 is formed on the protection layer 70. The pixel electrode 82 receives an image signal from the thin film transistor and then generates an electric field together with the electrodes on the other substrate. The pixel electrode 82 may include a transparent conductive material such as IZO or ITO.

The pixel electrode 82 is physically or electrically connected to the drain electrode 66 through the contact hole 76 and receives image signals. The pixel electrode 82 may be superposed on the adjacent gate line 22 and on the data line 62, thereby improving a numerical aperture. The pixel electrode 82 may not be superposed on the gate line 22 and on the data line 62 as shown in FIG. 16.

The pixel electrode 82 is also connected to the conductive pattern for the maintaining condenser 64 through the contact hole 72 and transmits the image signals to the conductive pattern 64.

An auxiliary gate end 86 is formed on the gate end 24 and an auxiliary data end 88 is formed on the data end 68. The auxiliary gate end 86 is connected to the gate end 24 through the contact hole 74, and the auxiliary data end 88 is connected to the data end 68 through the contact hole 78. The auxiliary gate end 86 and the auxiliary data end 88 improve adhesion between an outer circuit device and the gate end 24 or the data end 68 and also protects ends. The auxiliary gate end 86 and the auxiliary data end 88 are optional elements.

Figure 16:
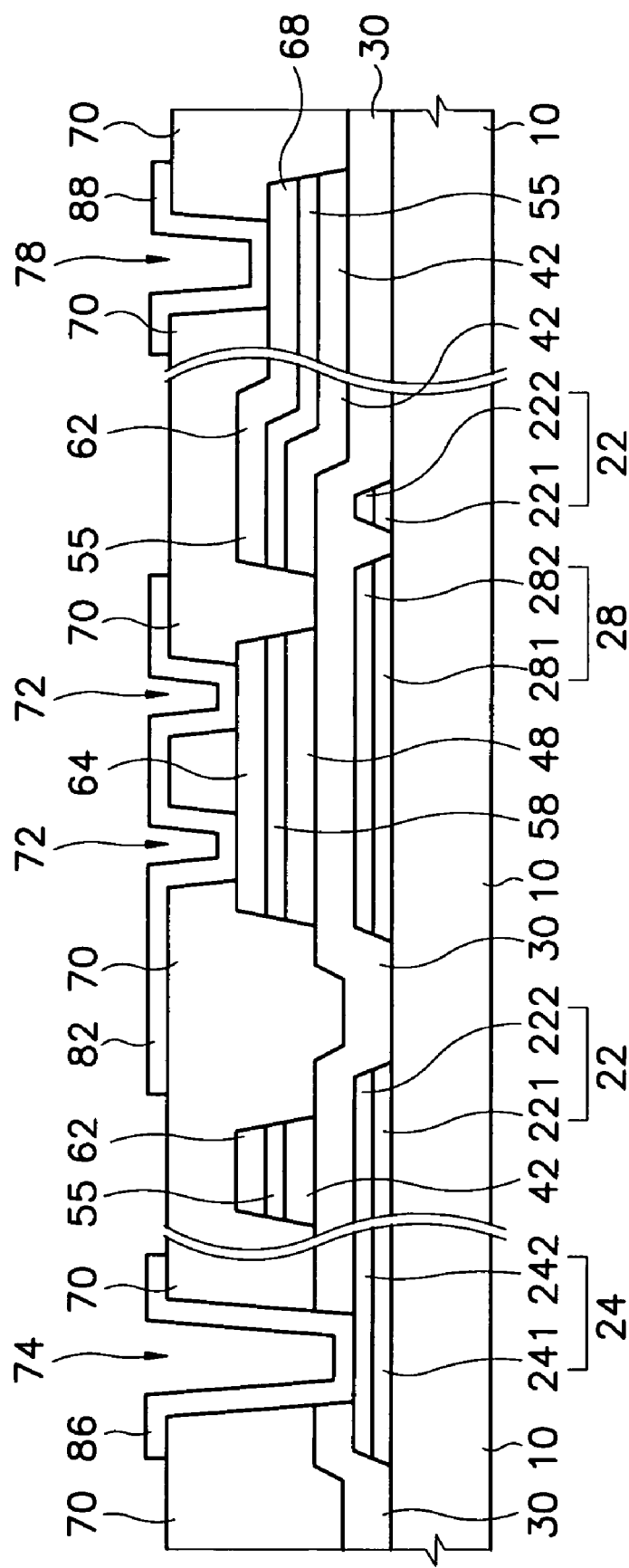
FIG. 16 is a cross-sectional view illustrating the thin film transistor substrate of FIG. 15 taken along a line VIII-VIII'.
Figure 17:
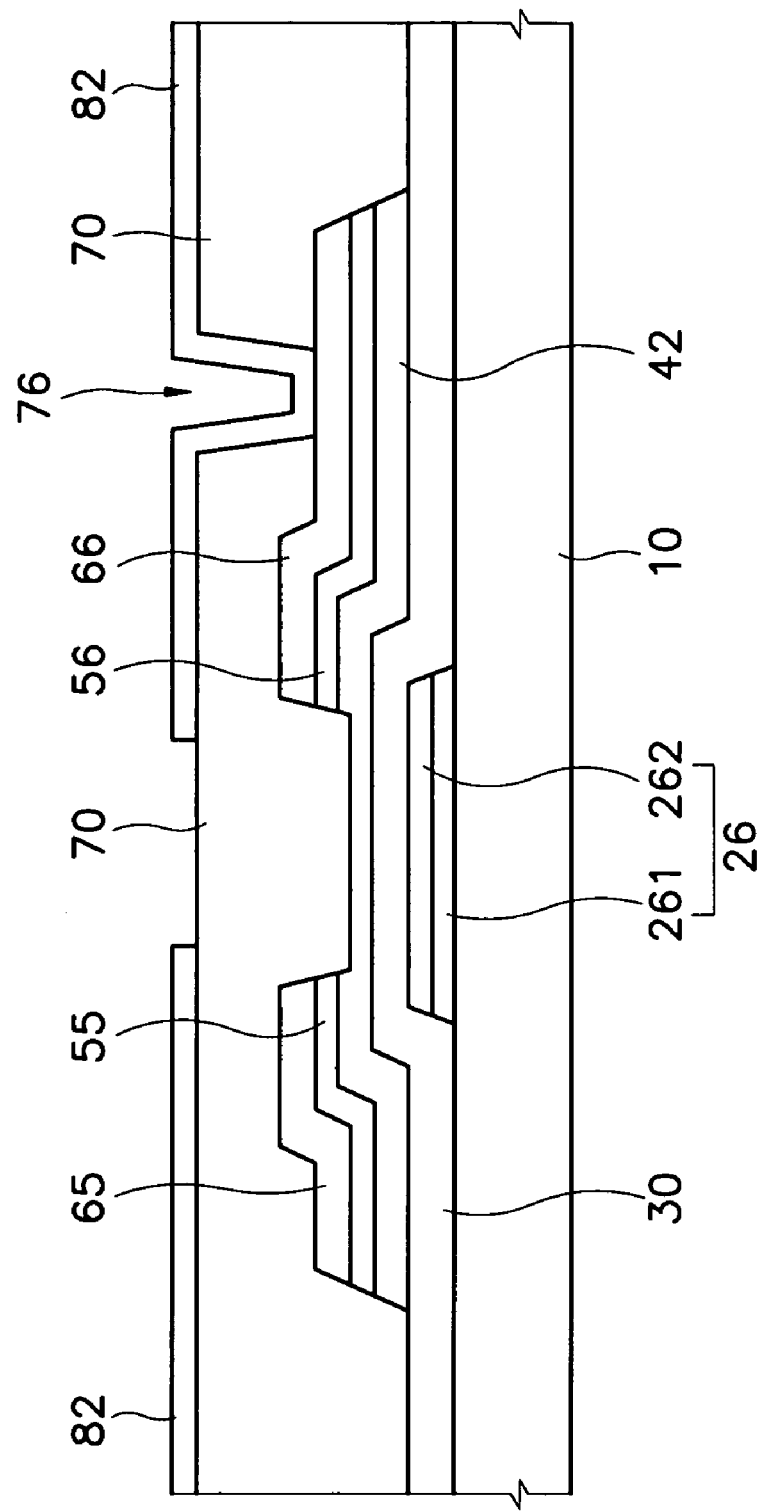
FIG. 17 is a cross-sectional view illustrating the thin film transistor substrate of FIG. 15 taken along a line IX-IX'.

A method of manufacturing the thin film transistor for the liquid crystal display device using 4 masks will be descried in detail with reference to FIGS. 15 to 17 and 18a to 25b in comparison with the method of manufacturing the thin film transistor using 5 masks as shown in FIGS. 15 to 17.

Figure 18A:
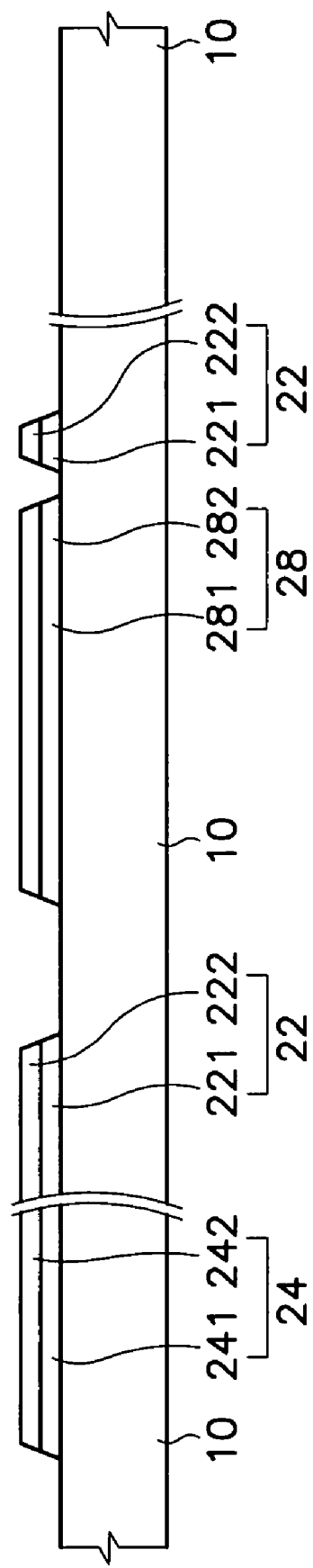
FIGS. 18A to 25B are cross-sectional views illustrating a method of manufacturing the thin film transistor substrate shown in FIGS. 16 and 17.
Figure 18B:
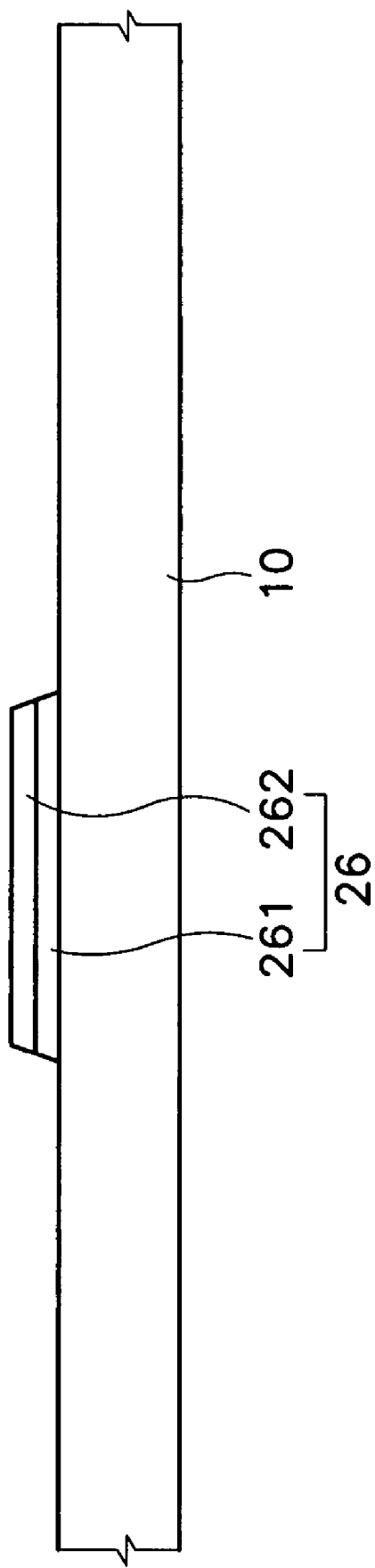

Referring to FIGS. 18A and 18B, as described above, a gate wiring layer is formed on an insulation substrate 10 in a double layer including a first gate wiring layer and a second gate wiring layer. The first gate wiring layer may include chromium or aluminum-neodymium alloy, and the second gate wiring layer may include aluminum-neodymium alloy or molybdenum. The gate wiring layer is patterned by a photolithography process to form a maintaining electrode line 28 and a gate wiring including a gate line 22, a gate end 24 and a gate electrode 26. The gate wiring includes first gate wirings 221, 241 and 261 and second gate wirings 222, 242 and 262. During the exposure process, a direction of scanning is substantially perpendicular to a longitudinal direction of a data line to be formed.

Figure 19A:
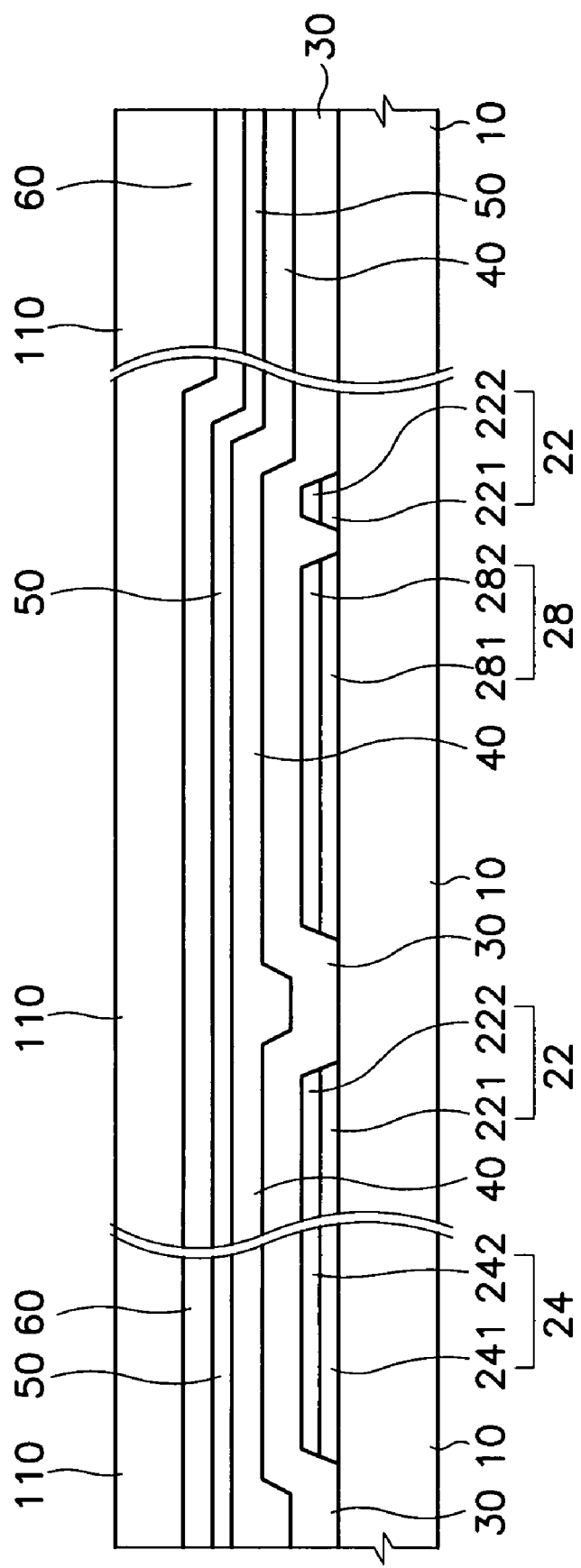
Figure 19B:
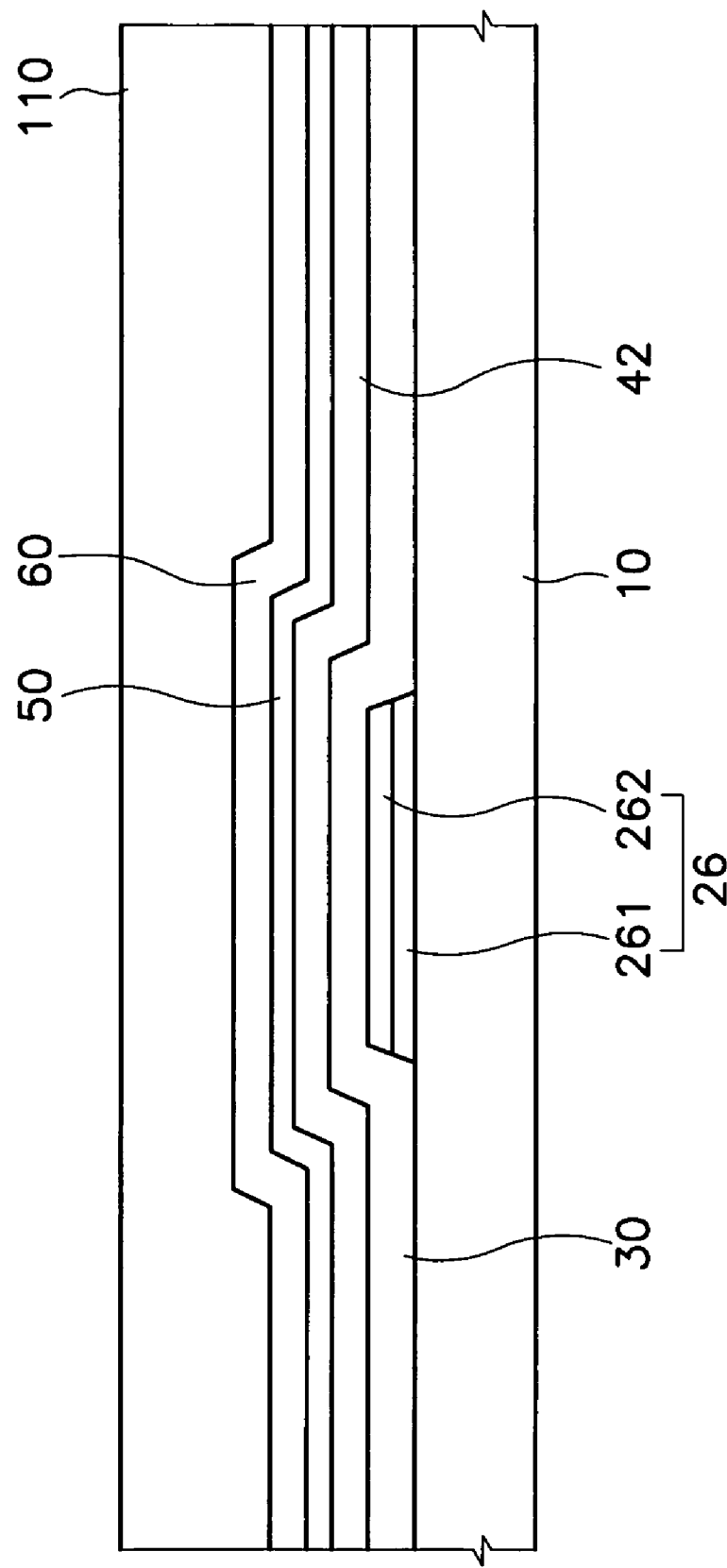

Referring to FIGS. 19A and 19B, a gate insulation layer 30 including silicon nitride, a semiconductor layer 40 and an ohmic contact layer 50 are deposited on the gate wiring to have a thickness of about 1,500 Å to 5,000 Å, about 500 Å to 2,000 Å and about 300 Å to 600 Å using a chemical vapor deposition (CVD) process, respectively. Molybdenum or molybdenum-tungsten alloy may be deposited on the ohmic contact layer 50 to form a conductive layer 60. A photosensitive layer 110 is coated on the conductive layer 50 to have a thickness of about 1 μm to 2 μm.

Figure 20A:
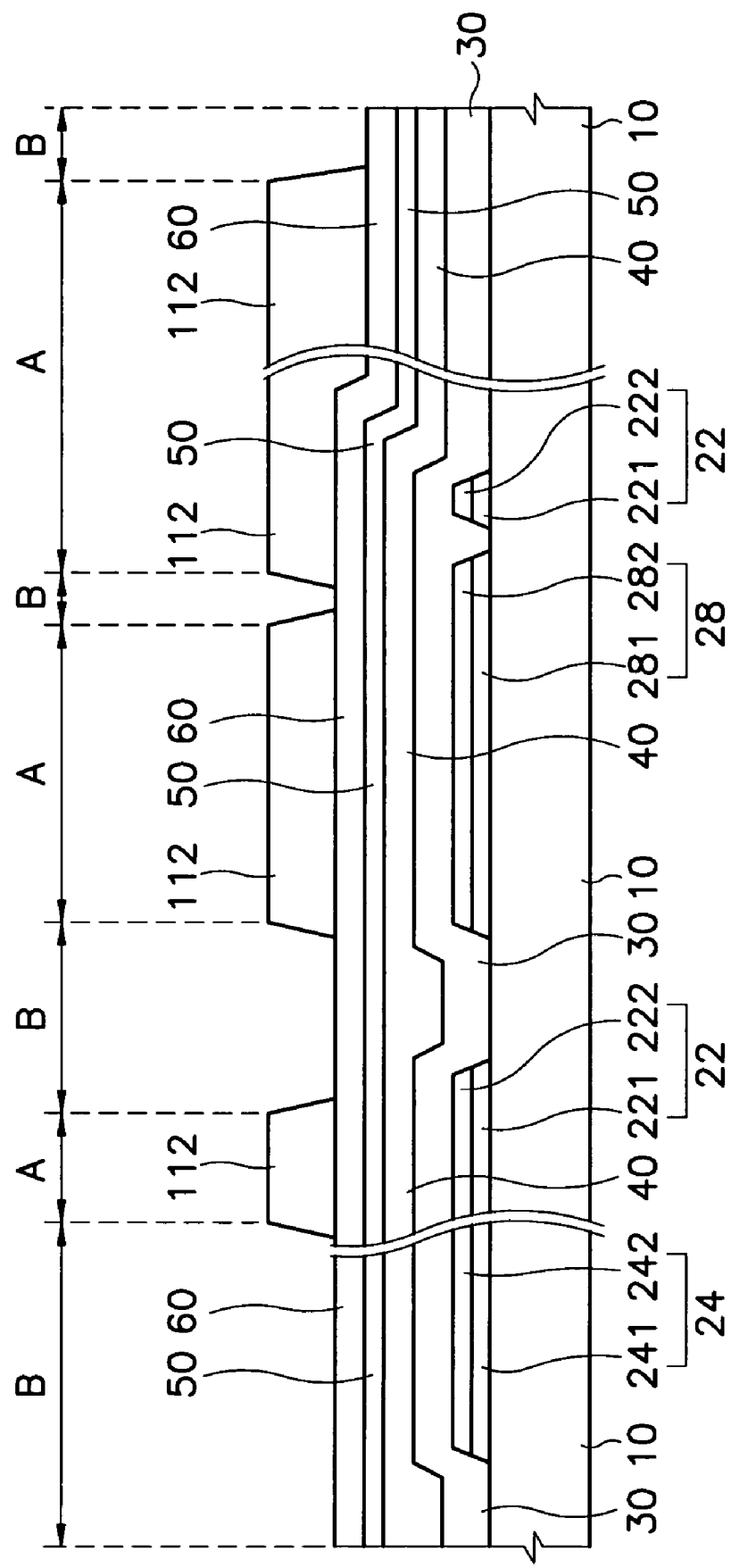

The light is irradiated onto the photosensitive layer 110 through a mask. The light is irradiated such that the direction of scanning is substantially perpendicular to the longitudinal direction of the data line to be formed. The photosensitive layer 110 is then developed to form the photosensitive layer patterns 112 and 114 as shown in FIGS. 20A and 20B.

The first portion of photosensitive layer pattern 114 disposed between the source electrode 65 and the drain electrode 66, which is in the channel portion 'C' of the thin film transistor, has a thickness thinner than the second portion of the photosensitive layer pattern 112 disposed in the data wiring portion 'A' where data wirings 62, 64, 65, 66 and 68 are to be formed. The photosensitive layer disposed on other portions 'B' is removed. The thickness ratio between the first portion of the photosensitive layer pattern 114 in the channel portion 'C' and the second portion of the photosensitive layer pattern 112 in the data wiring portion 'A' varies depending on the conditions of the subsequent etching process. The thickness of the first portion of the photosensitive layer pattern 114 is preferably less than half of the second portion of the photosensitive layer pattern 112. Preferably, the first portion of the photosensitive layer pattern 114 has a thickness of about 4,000 Å or less.

There are several methods for varying the thickness of the photosensitive layer depending on the position. To control the transmittance of the light in the data wiring portion 'A', a slit pattern or lattice pattern is formed on the photosensitive layer or a semi-transparent layer is used.

When using the silt, it is preferable that the interval between the patterns or the width of the slit is smaller than the resolution of the exposure system. When using a semi-transparent layer, it is considered in the mask making process that the semi-transparent layer has different transmittance or thickness to control the transmittance.

In case of a positive photosensitive layer, when the photosensitive layer is exposed through the mask, the polymers in the photosensitive layer directly exposed by the light are decomposed. The polymers in the photosensitive layer where the slit pattern or the semi-transparent layer is formed are partially decomposed due to insufficient irradiation. The polymers in the photosensitive layer blocked by the mask are hardly decomposed.

Then, the photosensitive layer is developed. The photosensitive layer portion where the polymers are not decomposed remains after the development. The photosensitive layer portion that is partially irradiated becomes thinner than the portion that is not irradiated. Since all the polymers in the photosensitive layer may be decomposed, exposing the photosensitive layer for an excessive time is unnecessary.

The first portion of the photosensitive layer pattern 114 is exposed using a photosensitive layer including reflowable material and a mask having a transmittable region and a blocking region. The first portion of the photosensitive layer pattern 114 is then developed and partly reflowed to the portion where the photosensitive layer does not remain.

The first portion of the photosensitive layer pattern 114, the conductive layer 60, the ohmic contact layer 50 and the semiconductor layer 40 are etched. In the data wiring portion 'A', the data wiring and the underlying layers remain after the etching process. In the channel portion 'C', only the semiconductor layer 60 should remain. In other portions 'B', the conductive layer 60, the ohmic contact layer 50 and the semiconductor layer 40 are removed to expose the gate insulation layer 30.

Figure 21A:
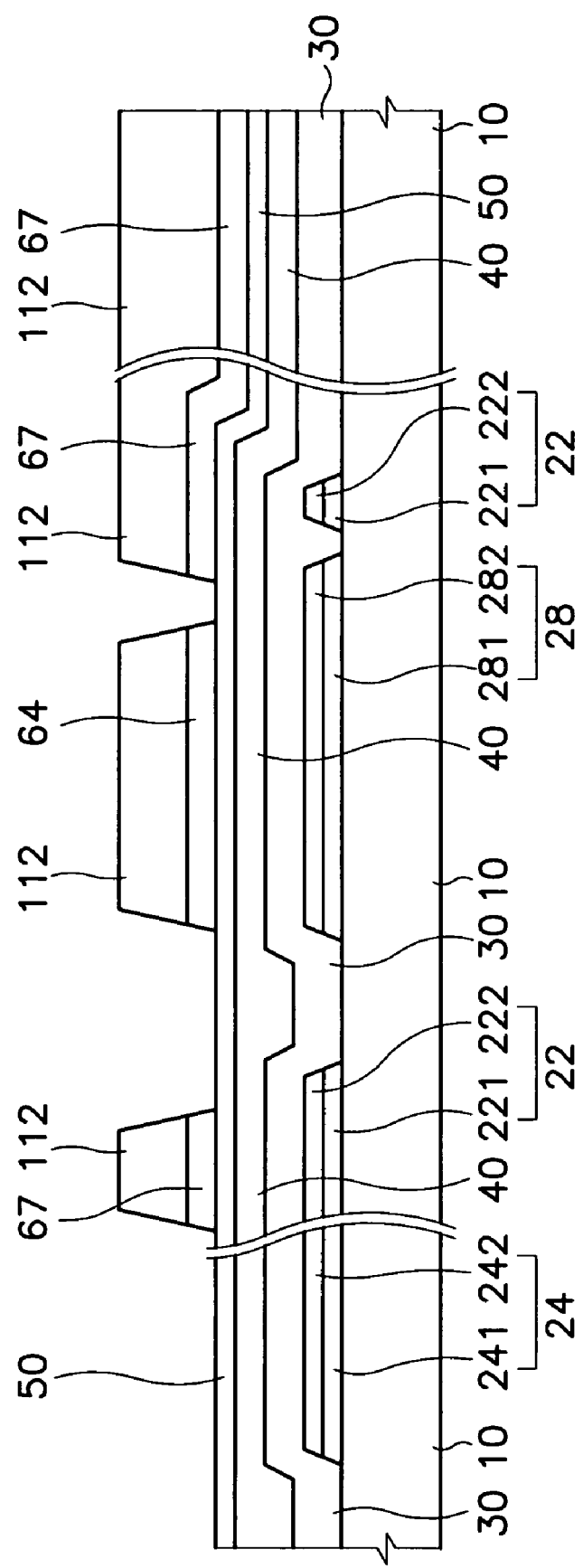
Figure 21B:
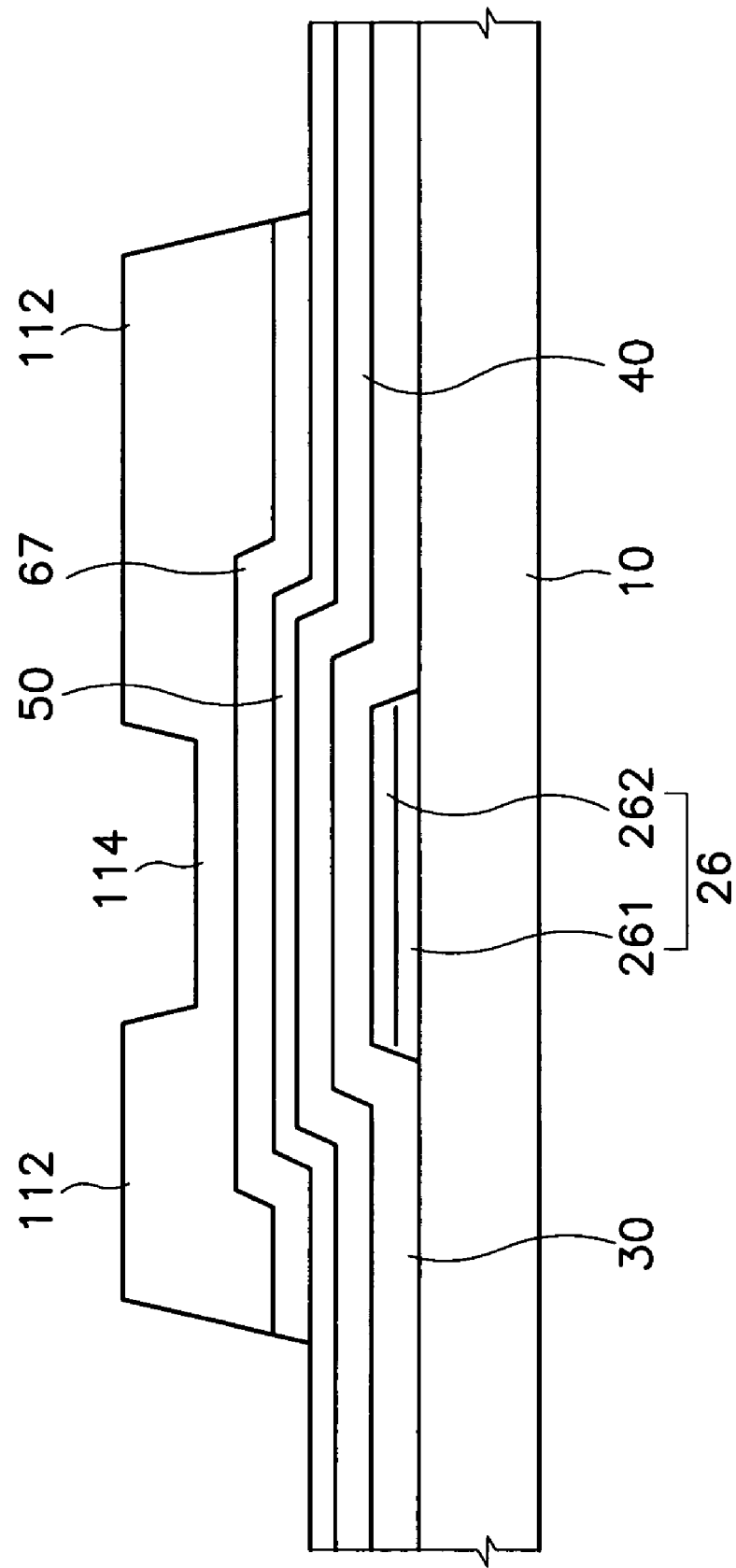

Referring to FIGS. 21A and 21B, the conductive layer 60 in other portions 'B' is removed to expose the ohmic contact layer 50. The conductive layer 60 is removed by a dry etching process or wet etching process preferably under the condition that the conductive layer 60 is etched and the photosensitive layer patterns 112 and 114 are hardly etched. In the dry etching process, however, it is hard to find the condition. Therefore, the photosensitive layer patterns 112 and 114 are etched together with the conductive layer 60. Here, the first portion of the photosensitive layer 114 is preferably thicker than in the wet etching process such that the first portion of the photosensitive layer 114 is not removed, thereby preventing the exposure of the conductive layer 60.

As a result, as described above, the conductive layer 60 in the channel portion 'C' and in the data wiring portion 'A' that are the conductive pattern for the source/drain 67 and the conductive pattern for the maintaining condenser 68 remains. The conductive layer 60 on other portions 'B' is removed to expose the underlying ohmic contact layer 50.

The remaining conductive pattern 67 and 64 have a shape substantially identical to the data wirings 62, 65, 66 and 68 except that the source and drain electrodes 65 and 66 are connected. In the dry etching process, the photosensitive layer patterns 112 and 114 are etched to some degree.

Figure 22A:
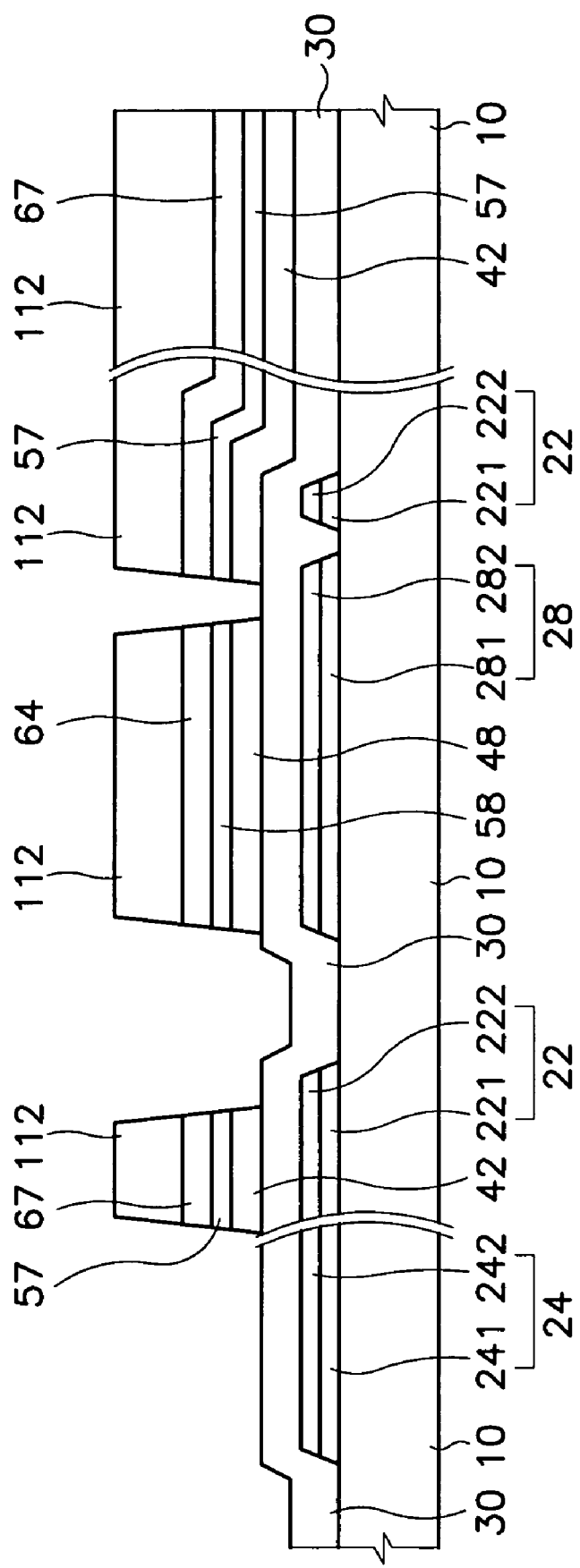

Referring to FIGS. 22A and 22B, the first portion of the photosensitive layer 114, the ohmic contact layer 50 and the underlying semiconductor layer 40 in other portions 'B' are simultaneously etched by the dry etching process. The etching process is performed under the condition that the photosensitive layer patterns 112 and 114, the ohmic contact layer 50 and the semiconductor layer 40 are simultaneously etched whereas the gate insulation layer 30 is not etched. Here, the etching selectivity of the semiconductor layer and the intermediate layer is almost zero. It is preferable that the etching selectivity of the photosensitive layer patterns 112 and 114 and the semiconductor layer 40 are substantially identical. For example, a mixture of sulfur hexafluoride gas ($SF_6$) and hydrogen chloride gas (HCl) etches the two layers to have substantially identical thickness. When the etching rate of the photosensitive layer patterns 112 and 114 and the semiconductor layer 40 are substantially identical, the thickness of the first portion of the photosensitive layer 114 is less than or equal to the summation of the thickness of the semiconductor layer 40 and the ohmic contact layer 50.

As a result, as shown in FIGS. 22A and 22B, the first portion of the photosensitive layer 114 in the channel portion C is removed to expose a conductive pattern 67. Additionally, the ohmic contact layer 50 and the semiconductor layer 40 in other portions 'B' are removed to expose the underlying gate insulation layer 30. The second portion of the photosensitive layer 112 in the data wiring portion 'A' is also etched and becomes thinner. Thus, semiconductor layer patterns 42 and 48 are completed. Reference numerals 57 and 58 represent an ohmic contact layer pattern under the conductive pattern for the source/drain 67 and an ohmic contact layer pattern under the conductive pattern for the maintaining condenser 64, respectively.

A photosensitive layer residue on the conductive pattern 67 in the channel portion 'C' is then removed by an ashing process.

Figure 23A:
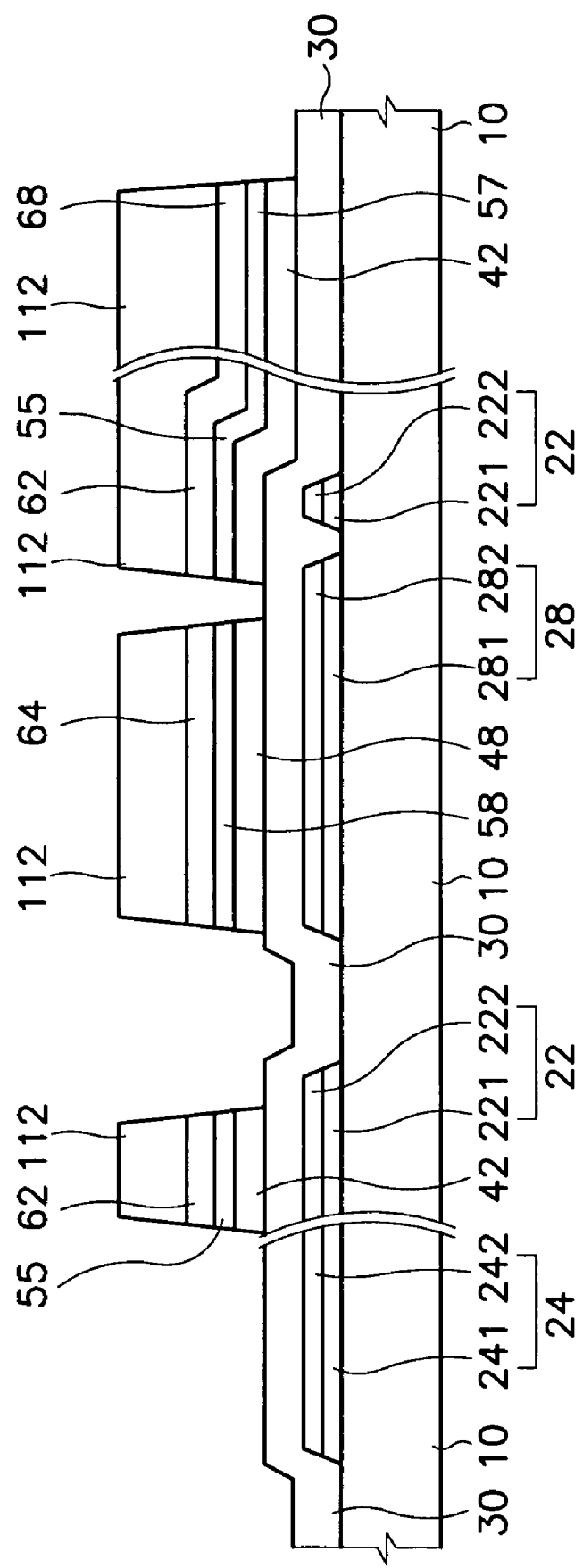
Figure 23B:
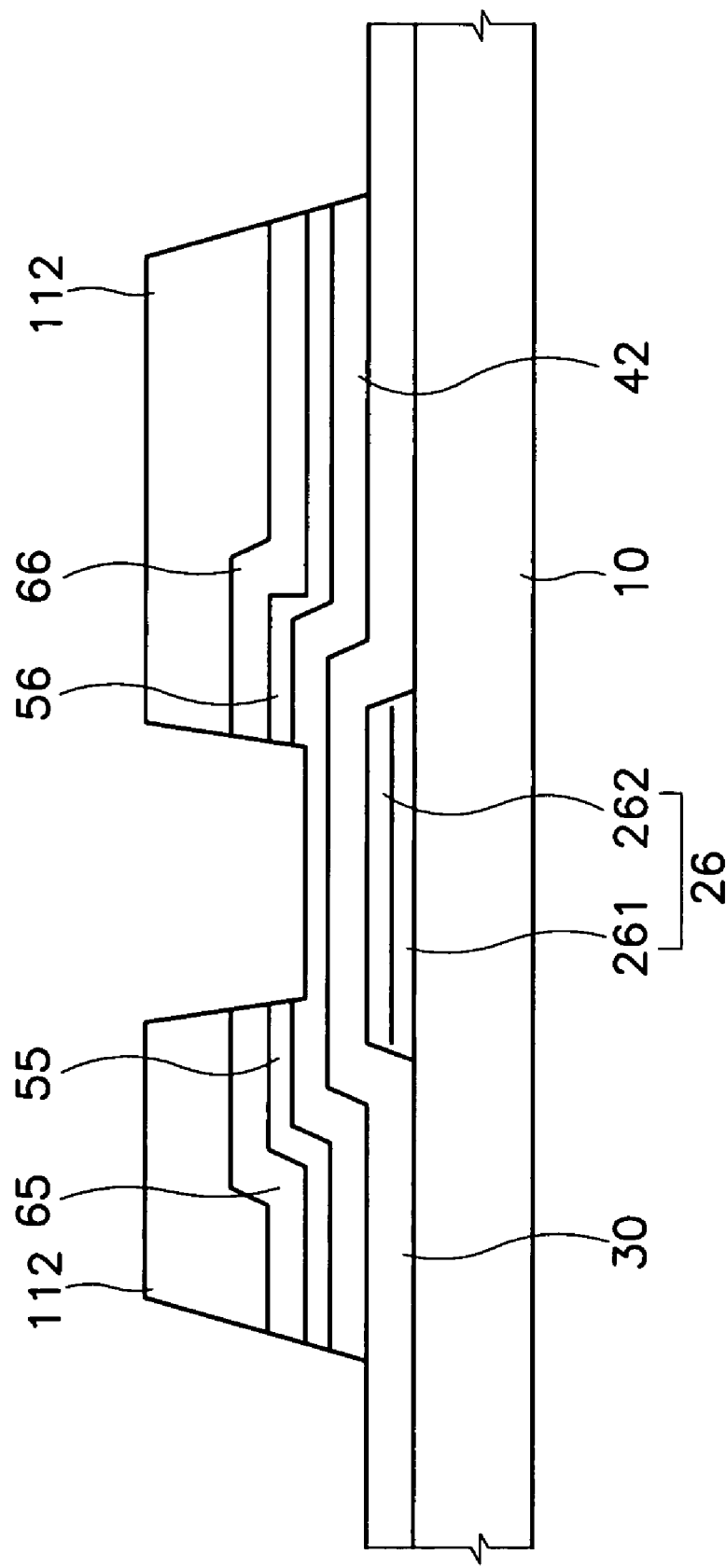

Referring to FIGS. 23A and 23B, the conductive pattern for the source/drain 67 in the channel portion 'C' and the underlying ohmic contact layer pattern for the source/drain 57 are removed by an etching process.

Both the conductive pattern for the source/drain 67 and the ohmic contact layer pattern 57 are etched by a dry etching process. In this case, it is preferable that etching selectivity between the conductive pattern 67 and the ohmic contact layer pattern 57 is large. When the etch selectivity is not large enough, the end point is hard to find and controlling the thickness of the semiconductor layer pattern 42 left in the channel portion 'C' becomes harder.

Alternatively, the conductive pattern 67 is etched by a wet etching process, and the ohmic contact layer pattern 57 is etched by a dry etching process. In this case, the conductive pattern 67 is etched, whereas the ohmic contact layer pattern 57 is hardly etched so that a stair shaped structure is formed.

Examples of the etching gas for the ohmic contact layer pattern 57 and the semiconductor layer pattern 42 include a mixture of carbon tetrafluoride ($CF_4$) and hydrogen chloride (HCl) or a mixture of carbon tetrafluoride ($CF_4$) and oxygen ($O_2$). The mixture of carbon tetrafluoride ($CF_4$) and oxygen ($O_2$) gives a semiconductor layer pattern 42 having a uniform thickness. Portions of the semiconductor layer pattern 42 may be removed and the second portion of the photosensitive layer pattern 112 is also etched to some degree. The etching process is performed under the condition that the gate insulation layer 30 is not etched. Moreover, the photosensitive layer pattern should be thick enough to prevent the etching of the second portion of the photosensitive layer pattern 112 and subsequent exposure of the underlying data wirings 62, 64, 65, 66 and 68.

Consequently, the data wirings 62, 64, 65, 66 and 68 and underlying ohmic contact layer pattern 55, 56 and 58s are completed, while the source electrode 65 and the drain electrode 66 are separated.

Finally, the second portion of the photosensitive layer pattern 112 remaining in the data wiring portion 'A' is removed. The second portion of the photosensitive layer pattern 112 may be removed after removing the conductive pattern 67 in the channel portion 'C' for the source/drain and before removing the underlying intermediate pattern 57.

As described above, the wet etching process and dry etching process are alternately performed. Alternatively, only the dry etching process is performed. In the latter case, the etching process is simple, but it is hard to find a proper etching condition. In the former case, the etching condition is easily found, but the etching process is rather complicated.

Figure 24A:
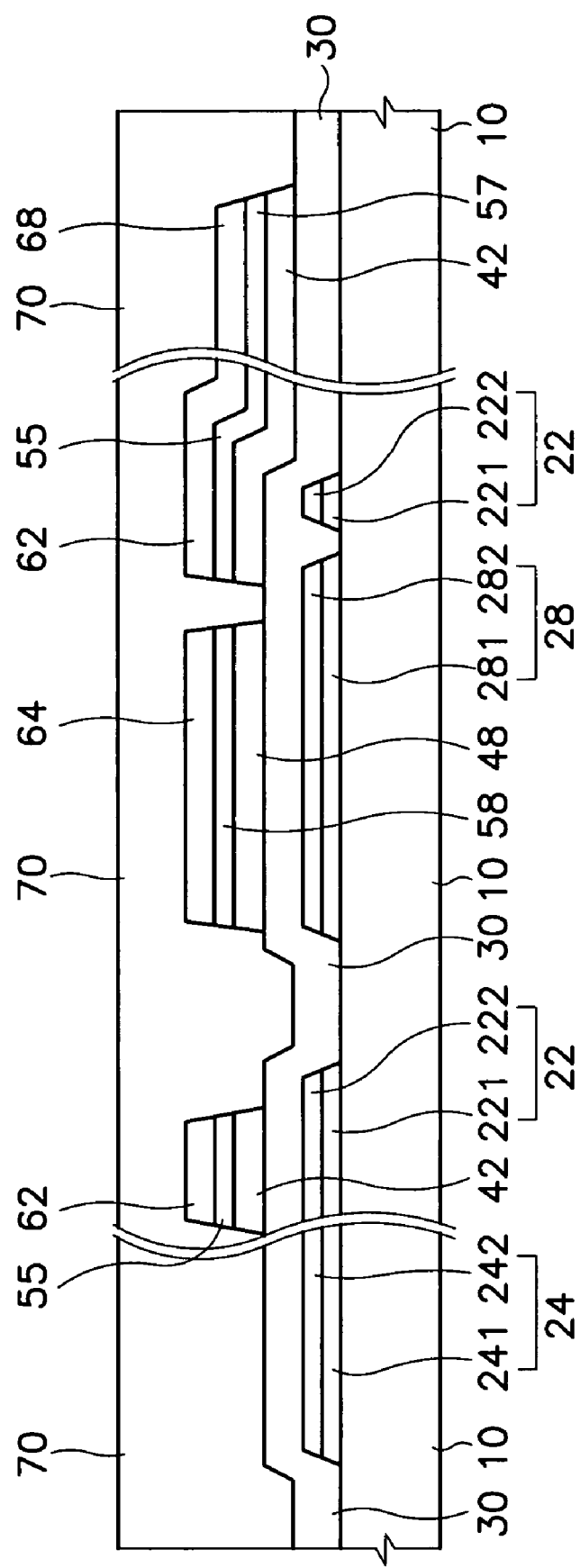
Figure 24B:
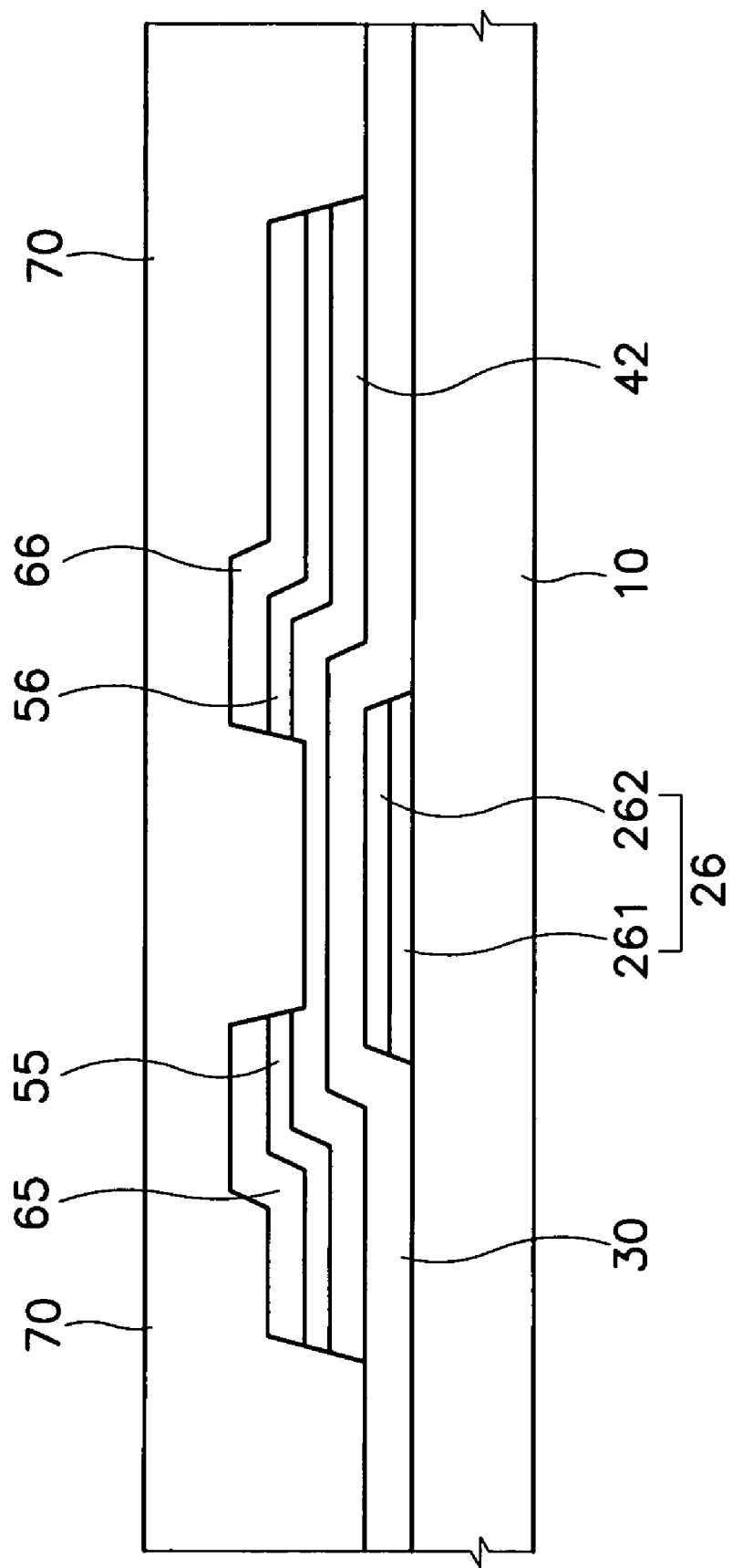

Referring to FIGS. 24A and 24B, a protection layer 70 is formed.

Figure 25A:
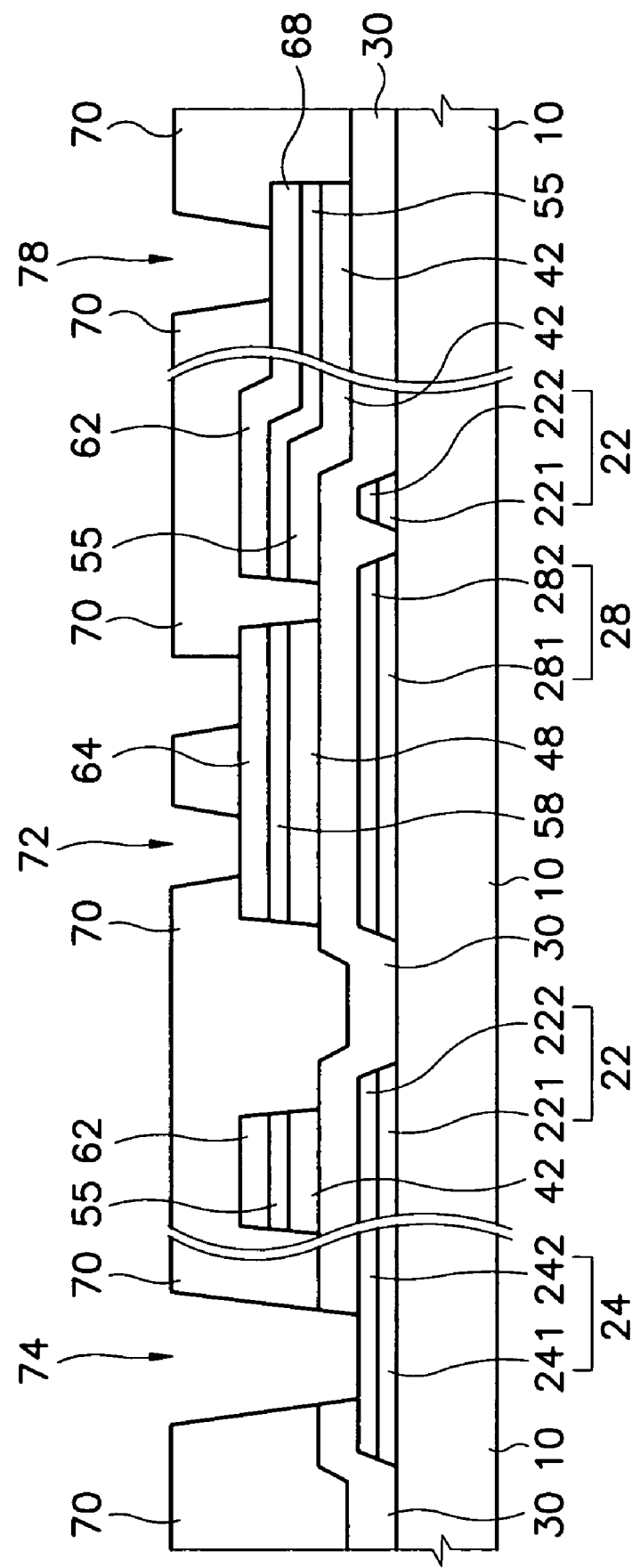
Figure 25B:
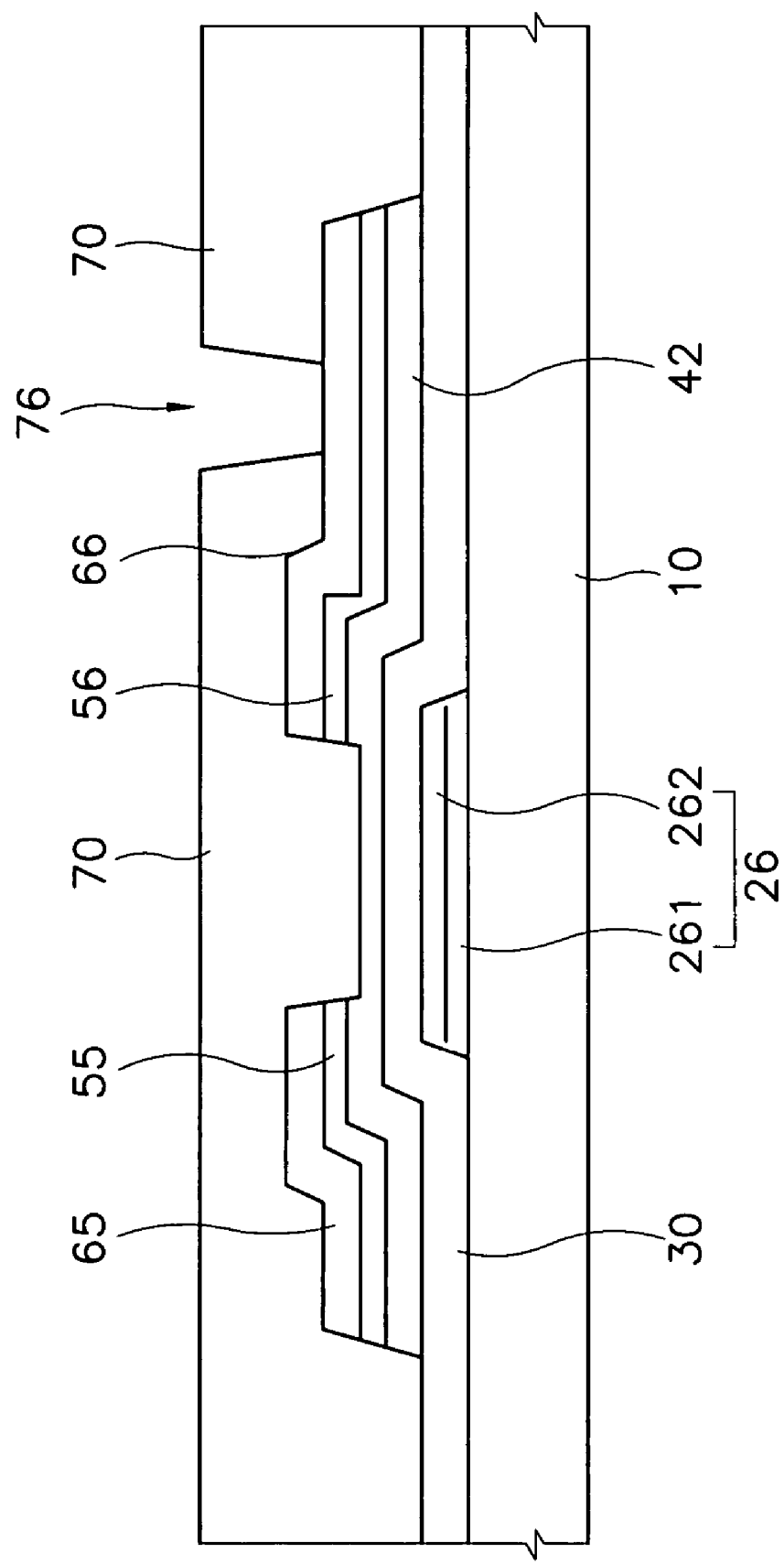

Referring to FIGS. 25A and 25B, the protection layer 70 and the gate insulation layer 30 are etched to form contact holes 76, 74, 78 and 72 exposing the drain electrode 66, the gate end 24, the data end 68 and the conductive pattern for the maintaining condenser 64, respectively. Each of the area of the contact holes 74 and 78 exposing the gate end 24 and data end 68 is preferably about 0.5 mm×15 μm to 2 mm×60 μm.

Finally, as shown in FIGS. 15 to 17, a transparent conductive layer including ITO or IZO is formed to have a thickness of about 400 Å to 500 Å. The transparent conductive layer is etched to form a pixel electrode 82 connected to the drain electrode 66 and the conductive pattern for the maintaining condenser 64, an auxiliary gate end 86 connected to the gate end 24 and an auxiliary data end 88 connected to the data end 68.

It is preferable to perform a pre-heating process before the deposition of ITO or IZO. The pre-heating process is preferably performed using a nitrogen gas. This prevents formation of a metal oxidation layer on an upper portion of the metal layers 24, 64, 66 and 68 that are respectively exposed by contact holes 72, 74, 76 and 78.

In this embodiment, the data wirings 62, 64, 65, 66 and 68, the ohmic contact layer patterns 55, 56 and 58 and semiconductor layer patterns 42 and 48 are formed using one mask.

Here, the source electrode 65 and the drain electrode 66 are separated. Thus, the process is simplified, and the effects described in the above embodiment are also obtained.

As described above, the variations of luminance due to the variations of the coupling capacitance between the data line and the pixel electrode are reduced using the exposure method. Thus, the failures of the vertical lines are reduced, and display uniformity and product yields are improved. The product yield is increased from about 20~30% to about 50% or more due to the reduced failures of the vertical lines.

Having described the exemplary embodiments of the invention and its advantages, it is noted that various changes, substitutions and alterations can be made herein without departing from the spirit and scope of the invention as defined by appended claims.

What is claimed is:

1. A method for exposing a layer with a light comprising:
   disposing a mask including a pattern shape of a pixel electrode over the layer formed on a substrate, wherein the substrate includes a data line; and
   scanning the mask with the light, such that a direction of the scanning is substantially perpendicular to a longitudinal direction of the data line, wherein the data line was previously formed by a previous scanning in perpendicular to the longitudinal direction.

2. The method of claim 1, further comprising:
   forming an insulation layer on the substrate having the data line; and
   forming the pixel electrode as a conductive pattern on the substrate having the insulation layer.

3. The method of claim 2, wherein an interval between the data line and the pixel electrode formed on the substrate is at least 6.25 µm.

4. The method of claim 1, wherein the substrate has a size of more than or equal to seventeen inches.

5. The method of claim 1, wherein the substrate corresponds to a substrate of a vertical alignment mode liquid crystal display device having a size of nineteen inches.

6. The method of claim 1, wherein one cell is exposed by the mask.

7. The method of claim 1, wherein the substrate corresponds to a substrate of a vertical alignment mode liquid crystal display device.

8. A method of forming a thin film transistor substrate for a liquid crystal display device comprising:
   forming a gate line on the substrate:
   forming a data wiring layer on the substrate, wherein the substrate includes the gate line;
   forming a photoresist layer on the data wiring layer;
   disposing a data line mask including a data line pattern shape over the photoresist layer formed on the substrate;
   scanning the data line mask with a light, such that a direction of the scanning is substantially perpendicular to a longitudinal direction of the data line pattern shape of the data line mask to expose the photoresist layer;
   patterning the data wiring layer to form a data wiring including a data line;
   forming a protection layer on the substrate; and
   forming a transparent conductive layer.

9. The method of claim 8, wherein an interval between the data line and a pixel electrode on the substrate is at least 6.25 µm.

10. The method of claim 9, wherein the substrate has a size of more than or equal to seventeen inches.

11. The method of claim 8, wherein one cell is exposed by the mask and forming the protection layer comprises patterning the protection layer using a second mask simultaneously exposing two cells, wherein the mask is smaller than the second mask.

12. The method of claim 8, wherein the substrate corresponds to a substrate of a vertical alignment mode liquid crystal display device.

13. The method of claim 12, wherein the substrate has a size of more than or equal to seventeen inches.

14. The method of claim 13, wherein the substrate has a size of more than or equal to seventeen inches.

15. The method of claim 14, wherein an interval between the data line and the pixel electrode on the substrate is at least 6.25 µm.

16. The method of claim 8, wherein the direction of the scanning is substantially parallel with a longitudinal direction of the gate line on the substrate to expose the photoresist layer.

17. A method of manufacturing a thin film transistor substrate for a liquid crystal display device, comprising:
   forming a gate wiring layer on a substrate;
   etching the gate wiring layer to form a gate wiring that includes a gate line, a gate end and a gate electrode;
   forming a gate insulation layer on the substrate having the gate wiring formed thereon;
   forming a semiconductor layer, an ohmic contact layer and a conductive layer on the gate insulation layer in sequence;
   forming a photosensitive layer pattern by scanning with a light through a data line mask, wherein a direction of scanning is substantially perpendicular to a longitudinal direction of a data line to be formed during an exposure process, and the photosensitive layer pattern includes a first portion, a second portion thicker than the first portion, and a third portion thinner than the first portion;
   forming a data wiring including a data line, a data end connected to the data line, a source electrode and a drain electrode, an ohmic contact layer pattern and a semiconductor layer pattern using the photosensitive layer pattern as a mask;
   forming a protection layer;
   patterning the protection layer and the gate insulation layer to form contact holes, the contact holes respectively exposing the gate end, the data end and the drain electrode;
   forming a transparent conductive layer; and
   etching the transparent conductive layer to form an auxiliary gate end, an auxiliary data end and a pixel electrode, the auxiliary gate end being connected to the gate end, the auxiliary data end being connected to the data end, the pixel electrode being connected to the drain electrode.

18. The method of claim 17, wherein the direction of scanning is substantially perpendicular to the longitudinal direction of the data line during an exposure process of a photoresist layer for forming the pixel electrode.

19. The method of claim 17, wherein an interval between the data line and the pixel electrode on the substrate is at least 6.25 µm.

20. The method of claim 17, wherein one cell is exposed by the mask.

21. The method of claim 17, wherein a plurality of cells are simultaneously exposed by the mask.

22. The method of claim 17, wherein the first portion is positioned between the source electrode and the drain electrode, and the second portion is positioned over an upper portion of the data wiring.

23. The method of claim 17, wherein the direction of the scanning is substantially parallel with a longitudinal direction of the gate line on the substrate during the exposure process of the photoresist layer for forming the pixel electrode.

24. A method of forming a thin film transistor substrate for a liquid crystal display device comprising:
- forming a data line, wherein forming the data line comprises
  - disposing a data line mask including a data pattern shape over a data layer formed on a substrate, and
  - scanning the data line mask with the light, such that a direction of the scanning is substantially perpendicular to a longitudinal direction of the data line pattern shape to form the data line; and
- forming a pixel electrode adjacent to the data line.

25. The method of claim 24, further comprising forming an insulation layer between the data line and the pixel electrode, wherein the data line formed on the substrate is electrically coupled with the pixel electrode disposed in a different layer from the data line to generate a coupling capacitance.

26. The method of claim 24, further comprising:
- forming an insulation layer on the substrate having the data line; and
- forming the pixel electrode as a conductive pattern on the substrate having the insulation layer, wherein a direction of scanning for forming the pixel electrode is substantially perpendicular to a longitudinal direction of the data line.

27. The method of claim 24, wherein the substrate has a size greater than or equal to about seventeen inches.

28. The method of claim 24, wherein the substrate corresponds to a substrate of a vertical alignment mode liquid crystal display device having a size of about nineteen inches.

29. The method of claim 24, wherein an interval between the data line and the pixel electrode formed on the substrate is at least 6.25 μm.

30. The method of claim 24, wherein one cell is exposed by the data line mask.

* * * * *